(12) United States Patent
Domino et al.

(10) Patent No.: US 10,396,737 B2
(45) Date of Patent: Aug. 27, 2019

(54) WIDE DYNAMIC RANGE AMPLIFIER SYSTEM

(71) Applicant: SKYWORKS SOLUTIONS, INC., Woburn, MA (US)

(72) Inventors: William J. Domino, Yorba Linda, CA (US); Thomas Obkircher, Santa Ana, CA (US); Adrian John Bergsma, Ottawa (CA); Peihua Ye, Irvine, CA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 15/808,341

(22) Filed: Nov. 9, 2017

(65) Prior Publication Data
US 2018/0138878 A1 May 17, 2018

Related U.S. Application Data

(60) Provisional application No. 62/420,875, filed on Nov. 11, 2016.

(51) Int. Cl.
| | |
|---|---|
| *H03G 3/20* | (2006.01) |
| *H03G 3/30* | (2006.01) |
| *H03F 1/56* | (2006.01) |
| *H03F 1/02* | (2006.01) |
| *H03F 3/195* | (2006.01) |
| *H03G 1/00* | (2006.01) |
| *H03F 3/45* | (2006.01) |

(52) U.S. Cl.
CPC ............. *H03G 3/30* (2013.01); *H03F 1/0205* (2013.01); *H03F 1/56* (2013.01); *H03F 3/195* (2013.01); *H03F 3/45475* (2013.01); *H03G 1/0088* (2013.01); *H03G 3/3042* (2013.01); *H03F 2200/09* (2013.01); *H03F 2200/294* (2013.01); *H03F 2200/387* (2013.01); *H03F 2200/451* (2013.01); *H03G 2201/103* (2013.01); *H03G 2201/106* (2013.01)

(58) Field of Classification Search
CPC ............... H03G 3/20; H03G 3/30; H03F 3/72
USPC ........................................ 330/144, 284, 51
See application file for complete search history.

(56) References Cited

U.S. PATENT DOCUMENTS

| | | | |
|---|---|---|---|
| 6,144,535 A | 11/2000 | Ishii | |
| 6,201,441 B1 | 3/2001 | Suematsu et al. | |
| 6,208,203 B1 | 3/2001 | Jung et al. | |
| 6,408,069 B1 | 6/2002 | Furlong | |

(Continued)

OTHER PUBLICATIONS 3.3 V, Upstream Cable Line Driver, AD8324, Analog Devices, Inc., 2016, <http://www.analog.com/media/en/technical-documentation/data-sheets/AD8324.pdf> [retrieved from the Internet on Dec. 15, 2017].

(Continued)

*Primary Examiner* — Steven J Mottola
(74) *Attorney, Agent, or Firm* — Lando & Anastasi, LLP

(57) ABSTRACT

Amplifier systems and methods are provided that include a fixed gain amplification stage coupled to an adjustable attenuation stage further coupled to a variable gain amplification stage. A controller controls an amount of attenuation provided by the adjustable attenuation stage and an amount of gain provided by the variable gain amplification stage to maintain any of various noise, efficiency, and/or linearity requirements of the amplifier system.

35 Claims, 11 Drawing Sheets

(56) References Cited

U.S. PATENT DOCUMENTS

| | | | |
|---|---|---|---|
| 7,342,955 | B2 | 3/2008 | Forest et al. |
| 7,649,418 | B2 | 1/2010 | Matsui |
| 7,952,433 | B2 | 5/2011 | An et al. |
| 8,446,143 | B2 | 5/2013 | Whittington et al. |
| 2003/0058041 | A1* | 3/2003 | Koizumi ................ H03F 3/189 330/51 |
| 2011/0256857 | A1* | 10/2011 | Chen ...................... H04B 1/525 455/422.1 |
| 2016/0248462 | A1 | 8/2016 | Danilenko et al. |

OTHER PUBLICATIONS

"ARA05050 Reverse Amplifier with Step Attenuator Data Sheet", Skyworks Solutions, Inc., 2016, <http://www.skyworksinc.com/uploads/documents/ARA05050_204227B.pdf> [retrieved from the Internet on Dec. 15, 2017].

"ARA2000 Address-Programmable Reverse Amplifier with Step Attenuator Data Sheet", Skyworks Solutions, Inc., 2016, <http://www.skyworksinc.com/uploads/documents/ARA2000_204228B.pdf> [retrieved from the Internet on Dec. 15, 2017].

"BGA3131 DOCSIS 3.1 upstream amplifier Product data sheet", NXP Semiconductors N.V., 2016, <https://www.nxp.com/docs/en/data-sheet/BGA3131.pdf> [retrieved from the Internet on Dec. 12, 2017].

"DOCSIS 3.0 Upstream Amplifier", Maxim, 2009, <https://media.digikey.com/pdf/Data%20Sheets/Maxim%20PDFs/MAX3518.pdf> [retrieved from the Internet on Dec. 15, 2017].

\* cited by examiner

| DOCSIS | TX LOW | TX HIGH | RX LOW | RX HIGH |
|---|---|---|---|---|
| 3.0 | 5MHz | 42MHz | 54MHz | 1002MHz |
| 3.0 | 5MHz | 85MHz | 108MHz | 1218MHz |
| 3.1 | 5MHz | 204MHz | 258MHz | 1794MHz |

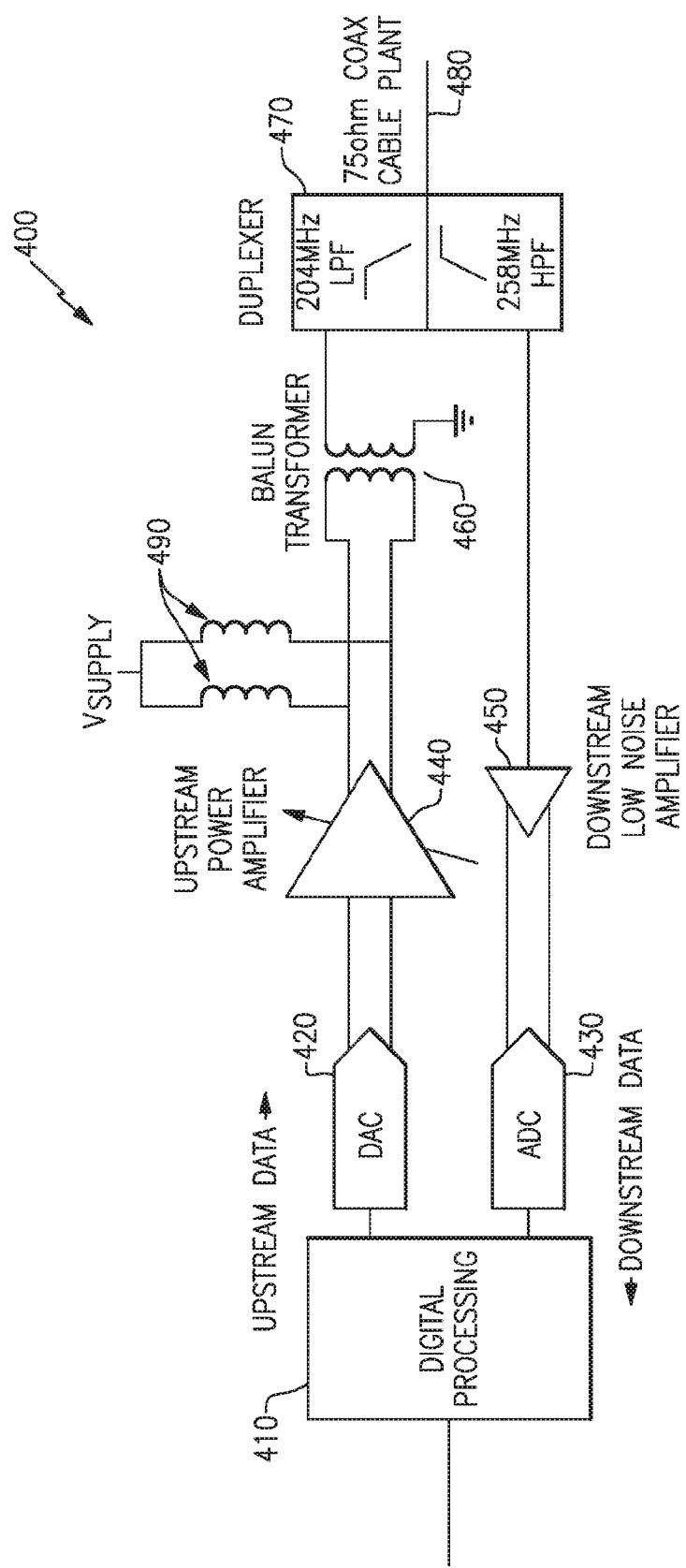

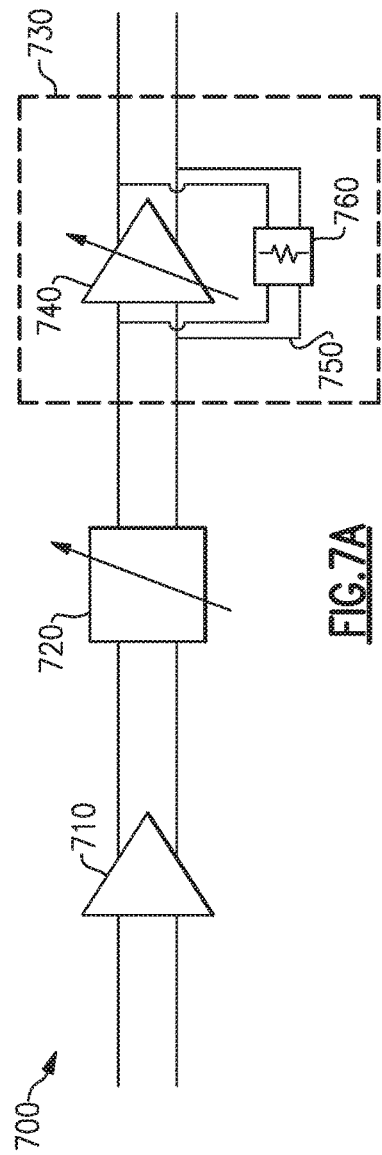
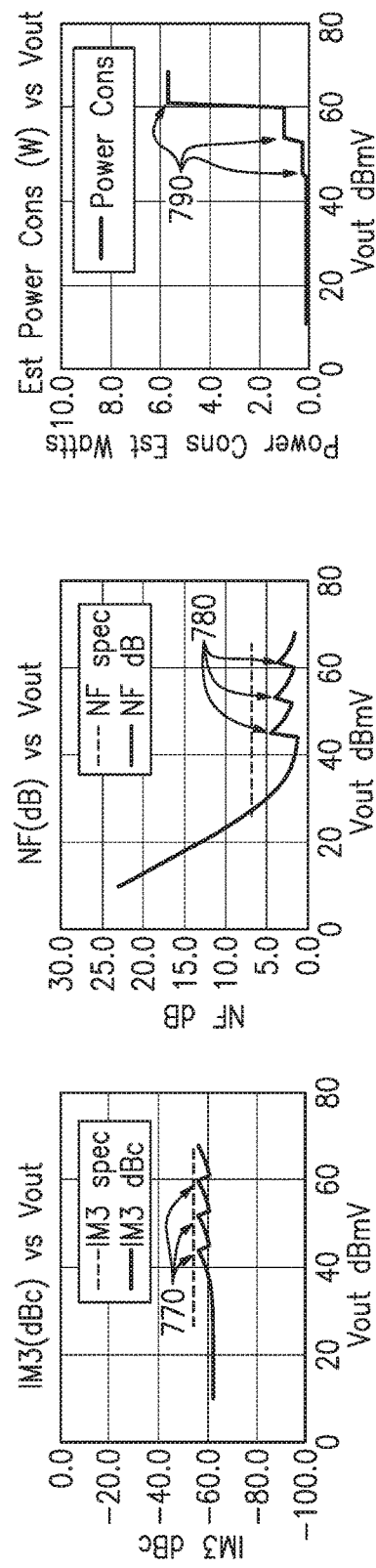

WIDE DYNAMIC RANGE AMPLIFIER SYSTEM

CROSS-REFERENCE TO RELATED APPLICATIONS

This application claims the benefit under 35 U.S.C. § 119(e) of co-pending U.S. Provisional Patent Application No. 62/420,875 titled WIDE DYNAMIC RANGE AMPLIFIER SYSTEM filed on Nov. 11, 2016.

This application further relates to U.S. patent application Ser. No. 15/808,486 filed on Nov. 9, 2017, and titled HIGH-LINEARITY VARIABLE GAIN AMPLIFIER WITH BYPASS PATH, which claims the benefit under 35 U.S.C. § 119(e) of U.S. Provisional Patent Application No. 62/420,326 titled HIGH-LINEARITY VARIABLE GAIN AMPLIFIER WITH BYPASS PATH filed on Nov. 10, 2016, each of which is herein incorporated by reference in its entirety for all purposes.

This application further relates to U.S. patent application Ser. No. 15/808,389 filed on Nov. 9, 2017, and titled AMPLIFIER SYSTEM WITH DIGITAL SWITCHED ATTENUATOR, which claims the benefit under 35 U.S.C. § 119(e) of U.S. Provisional Patent Application No. 62/420,681 titled AMPLIFIER SYSTEM WITH DIGITAL SWITCHED ATTENUATOR filed on Nov. 11, 2016, each of which is herein incorporated by reference in its entirety for all purposes.

This application further relates to U.S. patent application Ser. No. 15/808,372 filed on even date herewith Nov. 9, 2017, and titled TRANSIENT OUTPUT SUPPRESSION IN AN AMPLIFIER, which claims the benefit under 35 U.S.C. § 119(e) of U.S. Provisional Patent Application No. 62/420,907 titled TRANSIENT OUTPUT SUPPRESSION IN AN AMPLIFIER filed on Nov. 11, 2016, each of which is herein incorporated by reference in its entirety for all purposes.

This application further relates to U.S. patent application No. 15/808,358 filed on even date herewith Nov. 9, 2017, and titled REDUCING IMPEDANCE DISCONTINUITIES ON A SHARED MEDIUM, which claims the benefit under 35 U.S.C. § 119(e) of U.S. Provisional Patent Application No. 62/421,084 titled REDUCING IMPEDANCE DISCONTINUITIES ON A SHARED MEDIUM filed on Nov. 11, 2016, each of which is herein incorporated by reference in its entirety for all purposes.

This application further relates to U.S. patent application No. 15/808,458 filed on even date herewith Nov 9, 2017, and titled TEMPERATURE COMPENSATED OSCILLATOR, which claims the benefit under 35 U.S.C. § 119(e) of U.S. Provisional Patent Application No. 62/420,806 titled TEMPERATURE COMPENSATED OSCILLATOR filed on Nov. 11, 2016, each of which is herein incorporated by reference in its entirety for all purposes.

BACKGROUND

Data Over Cable Service Interface Specifications (DOCSIS) are developed by CableLabs, a non-profit consortium of cable operators focused on technologies and specifications for delivery of data signals that carry information such as data, video, voice, or other information, and for delivery of additional next generation services. DOCSIS defines the signal parameters for communications transmissions over a cable service infrastructure.

Evolution in the cable industry, particularly in the cable television service, has resulted in the reduction or elimination of traditional analog television channels that previously utilized frequencies as low as 54 MHz in the United States. This has freed spectrum within the cable system infrastructure, and the progression of DOCSIS specifications has begun to incorporate more of this spectrum. DOCSIS 3.1, for example, specifies an upstream frequency range of 5 MHz up to 204 MHz, which is almost 2.5 times the frequency range supported by DOCSIS 3.0, covering more than five and a third octaves. Additionally, full compliance with DOCSIS 3.1 requires support for power output up to 65 dBmV into 75 Ohm loads across the entire spectrum. Conventional amplifiers for these systems have not met the demanding challenges of power output dynamic range across the wide spectrum range necessary for full compliance with DOCSIS 3.1 and anticipated future standards.

SUMMARY

Aspects and examples are directed to amplifier systems and components thereof, and to devices, modules, and systems incorporating the same. Amplifier systems and methods disclosed herein are capable of a high range of dynamic power output across a broad frequency spectrum. In some examples, a combination of amplification and attenuation components are applied to meet various challenges of maintaining linearity and noise output limits, among other criteria.

According to one aspect, a broadband amplifier assembly having a signal input and a signal output is provided and includes a fixed gain amplifier having an input and an output, the input coupled to the signal input, an adjustable attenuator having an input and an output, the input of the adjustable attenuator being coupled to the output of the fixed gain amplifier, a variable gain amplifier having an input coupled to the output of the adjustable attenuator and an output coupled to the signal output, the variable gain amplifier having a substantially constant input-referred linearity across a range of gain levels, and a controller configured to control an amount of attenuation provided by the adjustable attenuator and an amount of gain provided by the variable gain amplifier.

Some embodiments include a bypass path switchably coupled in parallel to the variable gain amplifier and one or more switches configured to switchably route a signal through one of the variable gain amplifier and the bypass path. The bypass path may include a bypass attenuator, and the bypass attenuator may be a fixed attenuator. In some embodiments, the bypass attenuator has an input impedance substantially matched to an output impedance of the adjustable attenuator and an output impedance substantially matched to an impedance of the signal output. The input impedance may have a value different from a value of the output impedance in certain embodiments.

In some embodiments, the controller is further configured to maintain the substantially constant input-referred linearity of the variable gain amplifier across a range of output power levels, at least in part by controlling a bias signal provided to the variable gain amplifier. In certain embodiments, the controller is configured to adjust the bias signal based upon at least one of a desired signal level at the signal output, a signal level at the input of the variable gain amplifier, and an attenuation level of the adjustable attenuator. The controller may be configured to adjust the bias signal based upon at least one of a linearity criterion and an efficiency criterion. The controller may be configured to adjust the bias signal based upon a lookup table.

According to another aspect, a broadband amplifier assembly having a signal input and a signal output is provided and includes a fixed gain amplifier having an input and an output, the input coupled to the signal input, an adjustable attenuator having an input and an output and having a range of attenuation levels, the input of the adjustable attenuator coupled to the output of the fixed gain amplifier, a variable gain amplifier having an input coupled to the output of the adjustable attenuator and an output coupled to the signal output, the variable gain amplifier having a range of gain levels, and a controller configured to control an amount of attenuation provided by the adjustable attenuator and an amount of gain provided by the variable gain amplifier to maintain a noise factor at the signal output across combinations of the range of gain levels and the range of attenuation levels.

Some embodiments include a bypass path switchably coupled in parallel to the variable gain amplifier and one or more switches configured to switchably route a signal through one of the variable gain amplifier and the bypass path. The bypass path may include a bypass attenuator, and the bypass attenuator may be a fixed attenuator. In some embodiments, the bypass attenuator has an input impedance substantially matched to an output impedance of the adjustable attenuator and an output impedance substantially matched to an impedance of the signal output. The input impedance may have a value different from a value of the output impedance in certain embodiments.

In certain embodiments, the controller is further configured to maintain the noise factor in part by controlling a bias signal provided to the variable gain amplifier. The controller may be configured to adjust the bias signal based upon at least one of a desired signal level at the signal output, a signal level at the input of the variable gain amplifier, and an attenuation level of the adjustable attenuator. The controller may be configured to adjust the bias signal based upon at least one of a linearity criterion and an efficiency criterion. The controller may be configured to adjust the bias signal based upon a lookup table.

According to another aspect, a broadband amplifier assembly having a signal input and a signal output is provided and includes a fixed gain amplifier having an input and an output, the input coupled to the signal input, an adjustable attenuator having an input and an output and having a range of attenuation levels, the input of the adjustable attenuator coupled to the output of the fixed gain amplifier, a variable gain amplifier having an input coupled to the output of the adjustable attenuator and an output coupled to the signal output, the variable gain amplifier having a range of gain levels, and a controller configured to control an amount of attenuation provided by the adjustable attenuator, to control a gain provided by the variable gain amplifier, and to control a bias signal provided to the variable gain amplifier across the range of gain levels.

In certain embodiments, the controller is further configured to control the bias signal based upon at least one of a linearity criterion and an efficiency criterion.

In some embodiments, the controller includes a bias control coupled to the variable gain amplifier to provide the bias signal to the variable gain amplifier, the bias signal being one of a bias current and a bias voltage.

Some embodiments include a bypass path switchably coupled in parallel to the variable gain amplifier and one or more switches configured to switchably route a signal through one of the variable gain amplifier and the bypass path. The bypass path may include a bypass attenuator, and the bypass attenuator may be a fixed attenuator. In some embodiments, the bypass attenuator has an input impedance substantially matched to an output impedance of the adjustable attenuator and an output impedance substantially matched to an impedance of the signal output. The input impedance may have a value different from a value of the output impedance in certain embodiments.

According to some embodiments, the controller is configured to maintain a substantially constant input-referred linearity of the variable gain amplifier across a range of output power levels, at least in part by controlling the bias signal provided to the variable gain amplifier. The controller may be configured to adjust the bias signal based upon at least one of a desired signal level at the signal output, a signal level at the input of the variable gain amplifier, and an attenuation level of the adjustable attenuator.

In some embodiments the controller is configured to adjust the bias signal based upon a lookup table.

According to another aspect, a multi-chip module having a signal input and a signal output is provided and includes a first die constructed from a GaAs ED-pHEMT technology and including components that form a fixed gain amplifier having an input and an output, the input of the fixed gain amplifier being coupled to the signal input, a second die constructed from a SOI technology and including components that form an adjustable attenuator having an input and an output, the input of the adjustable attenuator being coupled to the output of the fixed gain amplifier, and a third die constructed from a BCD-LDMOS technology and including components that form a variable gain amplifier having an input and an output, the input of the variable gain amplifier being switchably coupled to the output of the adjustable attenuator, and the output of the variable gain amplifier being switchably coupled to the signal output.

Certain embodiments include a fourth die constructed from a bulk CMOS technology and including components that form a controller having a plurality of control outputs, the plurality of control outputs including a first control output coupled to the fixed gain amplifier, a second control output coupled to the adjustable attenuator, and a third control output coupled to the variable gain amplifier.

In some embodiments, the second die further includes components that form a signal switch, the signal switch being configured to provide the switchable coupling between the output of the adjustable attenuator and the input of the variable gain amplifier.

According to some embodiments, the second die further includes components that form a fixed attenuator, an input of the fixed attenuator being switchably coupled to the output of the adjustable attenuator and an output of the fixed attenuator being switchably coupled to the signal output. A characteristic impedance of the output of the fixed attenuator may be different from a characteristic impedance of the input of the fixed attenuator.

Some embodiments also include a receive signal input and a receive signal output, and an additional die including components that form a receive amplifier having an input coupled to the receive signal input and having an output coupled to the receive signal output.

Still other aspects, examples, and advantages are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

Various aspects and embodiments described herein may include means for performing any of the described methods or functions.

In the event of inconsistent usages of terms between this document and documents incorporated herein by reference, the term usage in the incorporated references is supplementary to that of this document; for irreconcilable inconsistencies, the term usage in this document controls.

BRIEF DESCRIPTION OF THE DRAWINGS

Various aspects of at least one example are discussed below with reference to the accompanying figures, which are not intended to be drawn to scale. The figures are included to provide illustration and a further understanding of the various aspects and examples, and are incorporated in and constitute a part of this specification, but are not intended as a definition of the limits of the invention. In the figures, identical or nearly identical components illustrated in various figures may be represented by like numerals. For purposes of clarity, not every component may be labeled in every figure. In the figures:

FIG. 4 is a schematic diagram of a cable modem;

FIG. 7A is a schematic diagram of another example of an amplifier system according to aspects of the present disclosure;

FIGS. 7B-7E are graphs of performance characteristics of the amplifier system shown in FIG. 7A;

DETAILED DESCRIPTION

Figures 1, 2:
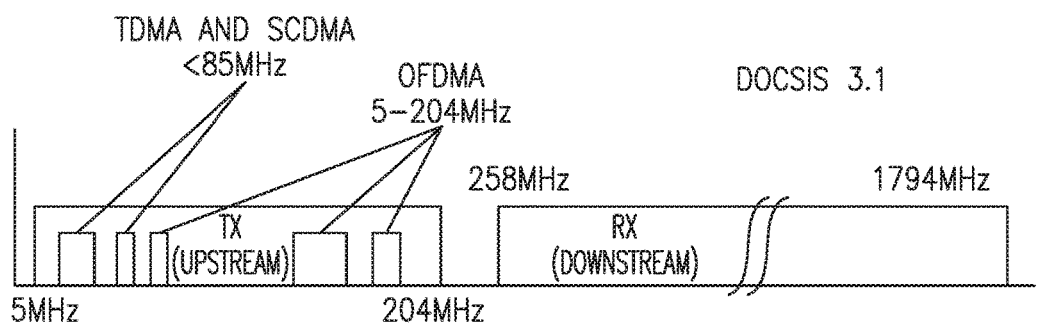
FIG. 1 is a table of frequency spectrum for various data over cable services interface specifications.
FIG. 2 is a graphical band plan of data over cable services frequency allocation.

It is to be appreciated that examples of the methods, systems, and apparatuses discussed herein are not limited in application to the details of construction and the arrangement of components set forth in the following description or illustrated in the accompanying drawings. The methods, systems, and apparatuses are capable of implementation in other examples and of being practiced or of being carried out in various ways. Examples of specific implementations are provided herein for illustrative purposes only and are not intended to be limiting. Examples disclosed herein may be combined with other examples in any manner consistent with at least one of the principles disclosed herein, and references to "an example," "some examples," "an alternate example," "various examples," "one example" or the like are not necessarily mutually exclusive and are intended to indicate that a particular feature, structure, or characteristic described may be included in at least one example. The appearances of such terms herein are not necessarily all referring to the same example. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Among other things, DOCSIS defines signal parameters for communications transmissions over a cable service infrastructure. The DOCSIS 3.1 specification follows upon an earlier DOCSIS 3.0 specification and includes significant changes to the interface specification for Cable Modems (CM's) and for Cable Modem Termination Systems (CMTS's). In a system for data over cable service, multiple sites, or customer premises, are typically connected to a common waveguide medium, such as a coaxial cable, that terminates at a hub operated by a cable operator. Each of the customer premises has one or more cable modems that receive data signals from the hub in a downstream direction and transmit data signals to the hub in an upstream direction. A cable modem termination system is placed at the hub and receives the individual upstream data signals from the cable modems and transmits the downstream data signals. Every data signal transmission is received by all other stations, CM's or the CMTS, coupled to the common (i.e., shared) medium. The data signals, downstream and upstream, include addressing information identifying to which cable modem they pertain, and each cable modem on the common medium generally ignores data signals not intended for it.

The following discussion generally involves upstream transmission signals and equipment. The cable modems on a common medium receive instructions from the CMTS directing the cable modems as to signal formatting and transmission parameters each cable modem is to use for its upstream transmissions. In particular, once associated with the network, each cable modem only transmits upstream data signals when capacity on the shared medium is assigned, or allocated, to it by the CMTS. DOCSIS 3.0 standardized upstream transmissions by the cable modems in two potential modes, TDMA mode and S-CDMA mode. Each mode includes frequency and time slot allocations to the cable modems, i.e., Frequency Division Multiple Access (FDMA) and Time Division Multiple Access (TDMA). The CMTS communicates frequency and time allocations in a particular Media Access Control (MAC) Management Message known as a bandwidth allocation map (MAP) message. Time allocations are given in mini-slots that are an integer multiple of 6.25 microseconds (µS). Modulation to be used by the cable modem is also assigned by the CMTS and is communicated in an Upstream Channel Descriptor (UCD) of a MAC Management Message. The fundamental upstream modulation scheme is quadrature amplitude modulation (QAM) with a constellation size up to 128, and the coding scheme includes Reed-Solomon (R-S) Forward Error Correction (FEC) coding, also with Trellis Coded Modulation (TCM) in North America. The S-CDMA mode further incorporates Synchronous Code Division Multiple Access (S-CDMA) as part of the modulation scheme.

According to DOCSIS 3.0, the spectrum available for allocation to upstream transmissions is from 5 MHz up to 85 MHz, just over four octaves. Depending upon the number of channels allocated, a cable modem must support a data signal transmission burst with power output (to a 75 Ohm medium, e.g., coaxial cable) per channel up to 53 dBmV or 56 dBmV in S-CDMA mode, and possibly up to 61 dBmV in TDMA mode. Power output from each cable modem is also controlled by the CMTS. In a process called ranging, the CMTS instructs each cable modem to increase or decrease transmission power such that upstream data signals arriving at the CMTS arrive with substantially the same signal levels regardless of which cable modem sent the signals. Cable modems that are further away from the CMTS on the shared medium may need to transmit with higher power to compensate for additional attenuation associated with a physically longer propagation along the length of the cable. Cable modems closer to the CMTS, along the shared medium, may need to transmit with lower power because their signals travel a shorter distance along the cable, therefore experiencing less attenuation.

Evolution in the cable industry has freed spectrum within the cable system infrastructure, and the progression of DOCSIS specifications has begun to incorporate more of this spectrum. DOCSIS 3.1 specifies an upstream frequency range of 5 MHz up to 204 MHz, a significantly broader frequency range than DOCSIS 3.0. Full compliance with DOCSIS 3.1 also requires support for power output up to 65 dBmV into 75 Ohm loads across the entire spectrum. Certain cable modem manufacturers may further require higher output signal levels, of, for example, 68 dBmV or higher.

The DOCSIS 3.1 specification also has strict requirements for Noise Figure (NF), Modulation Error Ratio (MER) and spurious emissions across the entire spectrum. Conventional cable modems have not been able to meet the DOCSIS 3.1 specifications over the full 5-204 MHz spectrum and have instead implemented only the newer modulation scheme of the DOCSIS 3.1 specification over a conventional spectrum range of up to 42 MHz or up to 85 MHz. In the near future, however, demand will increase to the point that cable modem manufacturers will be required to support the full spectrum of the DOCSIS 3.1 specification from 5-204 MHz.

In addition to the requirement to support power output up to 65 dBmV or more into 75 Ohm loads across the entire upstream spectrum from 5-204 MHz, with accompanying noise figure, modulation error ratio, and spurious emissions limitations, a cable modem also must be capable of adjusting upstream output power to accommodate ranging operations of the CMTS, i.e., to adjust output power as instructed by the CMTS such that the data signals received at the CMTS from all cable modems in the system arrive with substantially the same power. A typical cable modem may provide an output power adjustable in 1 dB steps from about 5 dBmV up to about 64 dBmV, with various noise figure, modulation error ratio, and spurious emission limits, across the DOCSIS 3.0 spectrum with a high end frequency of 42 MHz or 85 MHz. As described above, DOCSIS 3.1 more than doubles this high end frequency to 204 MHz, while maintaining the lower edge of 5 MHz, with similarly stringent noise figure, modulation error ratio, and spurious emission limits.

Radio Frequency (RF) power amplifier manufacturers for the cable modem industry are challenged to design amplifiers capable of providing adjustable signal output powers spanning 58 dB or more (e.g., 10-68 dBmV at 75 Ohms) across a frequency band spanning more than 5 octaves (e.g., 5-204 MHz), while maintaining stringent noise figure and modulation error ratio requirements across all output signal levels and frequencies. Additionally, at least because cable modems connect to a shared medium, they are desired to behave well in other aspects, such as to present a consistent impedance to the cable to reduce signal reflections, and to limit spurious emissions.

FIG. 1 is a table illustrating frequency spectrum allocations made under DOCSIS 3.0 and 3.1. Each specifies at least one pair of low and high edge frequencies for a transmit range and for a receive range. The terms transmit and receive in the table are from the perspective of a cable modem. That is, the transmit frequency range is the upstream range, for data signals sent from a cable modem (CM) to a cable modem termination system (CMTS), and the receive frequency range is the downstream range, for data signals sent from the CMTS to one or more CM's. It can be seen from the table of FIG. 1 that the DOCSIS standard has evolved over time to increase the frequency allocations to each of the upstream (transmit) and downstream (receive) frequency ranges. At least in part, some of the additional frequency ranges have become available for data signals over time as the cable service industry has transitioned to digital for all services, freeing up frequency ranges that were once used for analog television channels. It can also be seen from the table of FIG. 1 that DOCSIS 3.1 increased the upstream frequency range by more than double the maximum range of DOCSIS 3.0, increasing the total bandwidth by a factor of nearly 2.4, by extending the upper edge of the frequency range from 85 MHz to 204 MHz. The full DOCSIS 3.1 upstream range spans more than five and a third octaves, as compared to the maximum DOCSIS 3.0 range of 5-85 MHz, at slightly over four octaves.

FIG. 2 is an illustration of the DOCSIS 3.1 frequency plan, with an x-axis for frequency, the upstream range of 5-204 MHz on a lower (left) range of the x-axis and the downstream range of 258-1794 MHz on an upper (right) range of the x-axis. DOCSIS 3.1 allows for some optional lower ranges, but a full, maximum bandwidth implementation of DOCSIS 3.1 is as shown. In addition to the extended frequency ranges and accordingly expanded bandwidths, DOCSIS 3.1 brings new modulation and coding schemes into the cable data services industry. DOCSIS 3.1 implements orthogonal frequency division multiple access (OFDMA) into the upstream channels, and allows allocation by the CMTS to the CM of a frequency range, rather than individual channels, and within the frequency range there are multiple subcarriers of either 25 kHz or 50 kHz spacing. To allow for backwards compatibility, a CMTS may continue to allocate channels within DOCSIS 3.0 frequency ranges, modulation, and coding schemes.

Figure 3:
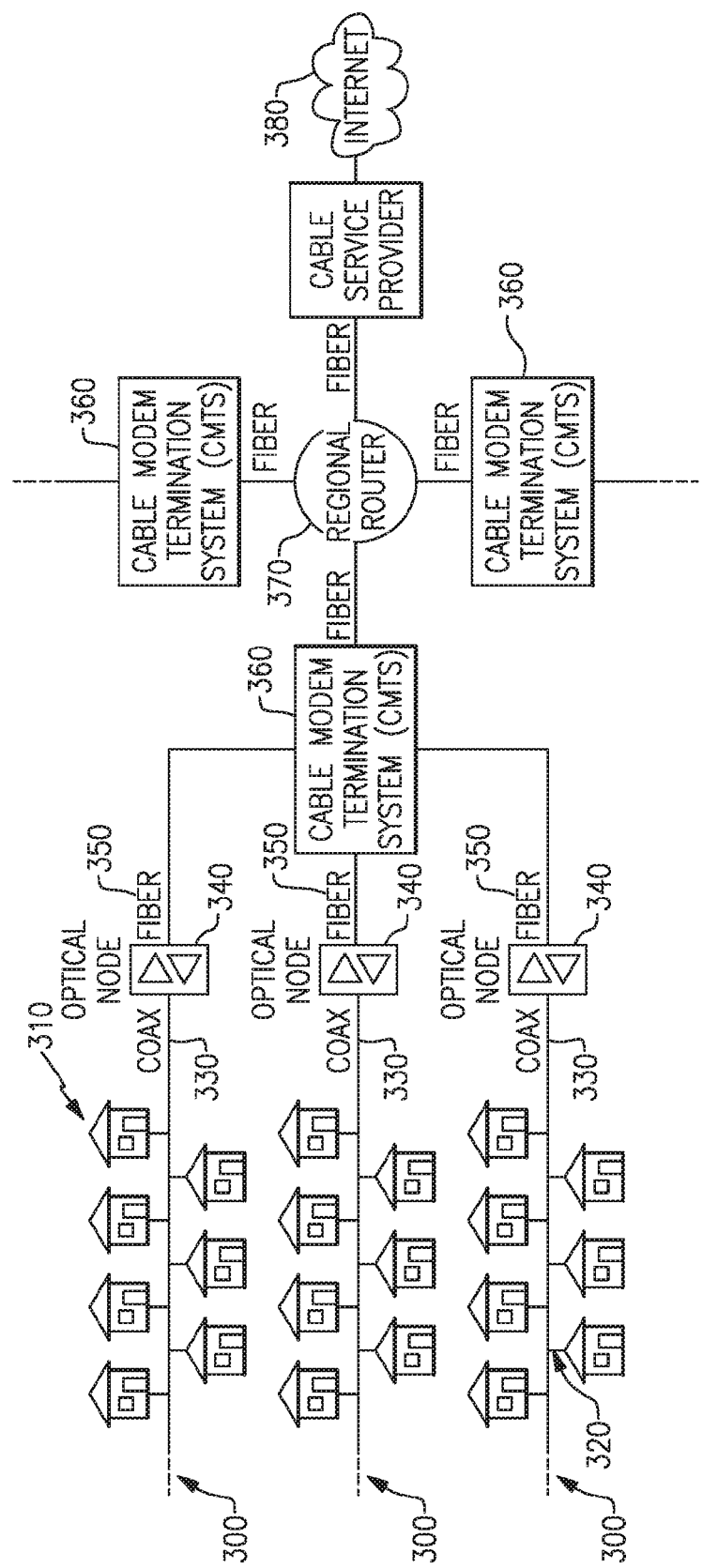
FIG. 3 is a schematic diagram of a data over cable services environment.

FIG. 3 is a schematic diagram for data over cable service in a residential environment implemented with a hybrid fiber-coax infrastructure. Shown in FIG. 3 are three distribution branches 300 serving multiple houses, or customer premises 310, each connected by at least one drop 320 from one of the distribution branches 300. Each customer premises 310 has a cable modem connected to a coaxial cable. Customer premises 310 that are connected via the same distribution branch 300 share a coaxial medium 330 in the neighborhood, such that all data signal transmissions on the shared coaxial medium 330 may be observed at, and may have an impact upon, other cable modems connected to the shared coaxial medium 330. In a hybrid fiber-coax system like that shown in FIG. 3, each distribution branch 300 coaxial medium 330 connects to an optical node 340 that converts radio frequency (RF) electrical signals from the coaxial medium 330 to optical signals on a fiber optic cable 350, and vice versa. The fiber optic cable 350 delivers the optical signals to a cable modem termination system (CMTS) 360. For purposes of the disclosure herein, the cable modems may be considered to communicate directly with the CMTS 360 via electrical radio frequency signals on the coaxial medium 330. Beyond the CMTS 360, and as shown for example in FIG. 3, the CMTS 360 may communicate with a regional router 370 and ultimately to a further network 380. Other examples of data over cable services may include other equipment and may provide services to commercial rather than residential customer premises.

FIG. 4 is a simplified schematic diagram of an example of a cable modem. The cable modem 400 transmits upstream data signals to a CMTS and receives downstream data signals from a CMTS. The cable modem 400 includes a signal processor 410 that processes received downstream data signals and generates upstream data signals for transmission. The signal processor 410 may operate in a digital domain and the cable modem 400 may further include a digital to analog converter (DAC) 420 that converts the upstream signals into an analog form, and an analog to digital converter (ADC) 430 that converts the downstream signals into digital form. An upstream amplifier 440 amplifies the upstream data signals to a power level sufficient for the upstream data signals to reach the CMTS 360 (see FIG. 3) with enough signal strength for the CMTS to reliably receive the upstream data signals. A downstream amplifier 450 amplifies received downstream data signals (from the CMTS) to a sufficient level for the signal processor 410 to reliably receive the downstream data signals. It should be appreciated that, for clarity, additional circuitry may be included that is not shown, such as up-converters for the transmit side and down-converters for the receive side, for example. The downstream amplifier 450 is typically a low noise amplifier (LNA) configured to sufficiently amplify the relatively low signal level of the received downstream data signal without adding significant noise. The output of the upstream amplifier 440 is coupled through a balun 460 to a duplexer 470 that couples the upstream data signals to a coaxial cable 480, which is further operatively coupled to a shared coaxial medium 330 of FIG. 3. The duplexer 470 also couples the downstream data signals from the coaxial cable 480 to provide the downstream data signals to the downstream amplifier 450. The duplexer 470 may include frequency selective filters to separate the downstream data signals arriving via the coaxial cable 480 from the upstream data signals being provided to the coaxial cable 480. As shown in FIG. 4, the upstream amplifier 440 may be implemented as a differential amplifier having differential inputs (e.g., each of a positive and a negative input, or two inputs accommodating a magnitude difference) and having a differential output (e.g., each of a positive and a negative output, or two outputs providing a magnitude difference). Additionally as shown in FIG. 4, the differential sides of one or more internal components of the upstream amplifier 440 may be coupled to a power supply voltage by each of a pair of electrical elements, for example, inductors 490.

According to aspects disclosed herein, the cable modem 400 supports the full upstream frequency range of DOCSIS 3.1 from 5 MHz up to 204 MHz with selectable output signal power controlled in multiple steps. In at least one embodiment, the cable modem 400 and the upstream amplifier 440 support output signal power up to 68 dBmV into a 75 Ohm coaxial cable with at least fifty nine (59) output signal power settings differing by a nominal 1 dB variation between adjacent settings. In some embodiments, the upstream amplifier 440 may include a multi-chip module including a substrate with one or more die to implement various features of the upstream amplifier 440. In some embodiments the upstream amplifier 440 may be included in a module that also includes the downstream amplifier 450.

In some embodiments, the upstream amplifier 440 may provide a combination of amplification and attenuation to provide a plurality of distinct output signal power settings. In one example the number of output signal power settings is fifty-nine. For example, the output signal power settings may span from a minimum output signal power of 10 dBmV up to 68 dBmV, selectable in nominal 1 dB increments, for example, or may span other output signal powers or may provide alternate selectable increments. In at least one embodiment, the upstream amplifier 440 provides a gain range of −23 dB to +35 dB.

An amplifier, such as the upstream amplifier 440, may be formed as an assembly, e.g., an amplifier assembly, of one or more stages having various functions and may include control components, e.g., a controller, that controls aspects of the stages and may have a communication interface to receive configuration parameters and instructions. The terms amplifier, amplifier assembly, and amplifier system may at times be used interchangeably herein and generally refer to one or more stages coupled to receive an input signal and to provide an output signal varying in signal level or power level. The terms amplifier, amplifier assembly, and amplifier system may at times refer to objects that include control components in combination with the one or more stages.

Figure 5D:
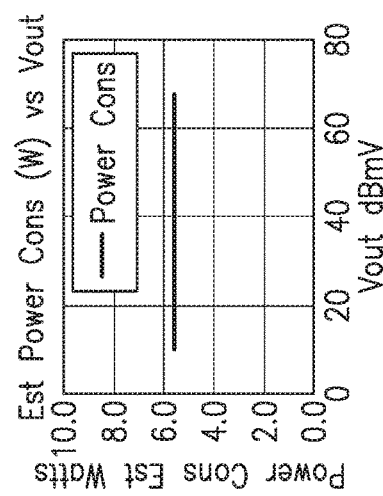
FIGS. 5B-5D are graphs of performance characteristics of the amplifier system shown in FIG. 5A.
Figure 5A:
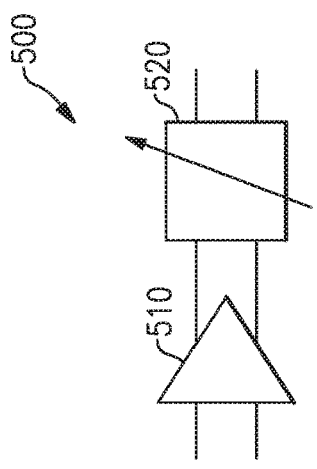
FIG. 5A is a schematic diagram of an example of an amplifier system according to aspects of the present disclosure.

One approach to designing an amplifier assembly capable of providing a broad range of selectable gain settings, and accordingly output signal power settings, is illustrated in FIG. 5A. FIG. 5A shows an amplifier system 500 including a fixed gain differential amplifier 510 and an adjustable attenuator 520. The adjustable attenuator 520 of FIG. 5A provides the adjustability to select gain values of the amplifier system 500 overall. The adjustable attenuator 520 may have a range of selectable attenuation levels, and may include a 0 dB attenuation level such that, when selected, the adjustable attenuator 520 passes signals from its input to its output substantially without attenuation. Accordingly, for the amplifier system 500 to have a maximum gain setting of 35 dB overall, the fixed gain amplifier 510 may have a fixed gain of 35 dB, so that the amplifier system 500 provides a net +35 dB gain as a combination of the fixed gain amplifier 510 gain of 35 dB and the adjustable attenuator 520 gain of 0 dB. The adjustable attenuator 520 may have fifty-nine selectable attenuation settings, in, for example, 1 dB increments, to provide a range of attenuation from 0 dB to 58 dB. Accordingly, the combination of the fixed gain amplifier 510 and the adjustable attenuator 520 may provide a net gain range of −23 dB to +35 dB by the amplifier system 500 overall.

Figure 5C:
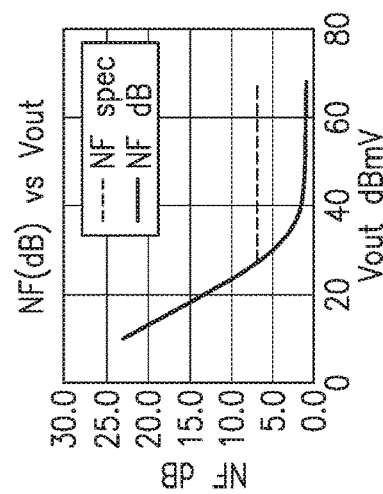
Figure 5B:
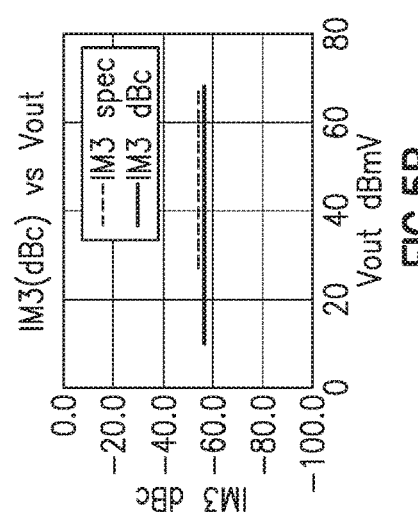

FIGS. 5B-5D illustrate third order intermodulation, noise figure (NF), and power consumption, respectively, associated with the amplifier system 500 of FIG. 5A, as a function of output signal voltage level. The graphs of FIGS. 5B-5D represent an amplifier system 500 with a fixed gain amplifier 510 having a noise figure of 1 dB, an input-referenced third order intersection point (IIP3) of 15 dBm, and an output-referenced third order intersection point (OIP3) of 50 dBm, and an adjustable attenuator 520 with IIP3 of 50 dBm. FIGS.

5B and 5C each also includes a dashed line that illustrates a DOCSIS 3.1 performance requirement for the respective performance criteria. FIGS. 5B and 5C show that the performance of the amplifier system 500 satisfies the DOCSIS 3.1 requirements. FIG. 5D shows, however, that the amplifier system 500 consumes substantially the same amount of power across all output signal power settings. The amplifier system 500 consumes substantially the same power at all gain settings, at least in part, because the fixed gain amplifier 510 operates at full power regardless of the output signal power level. Lower output signal levels are provided by the amplifier system 500 by absorbing an adjustable amount of the power in the adjustable attenuator 520. The result is that selecting low output signal levels does not reduce power consumption and may cause significant heating as the adjustable attenuator 520 converts the excess power to thermal energy.

Figure 6A:
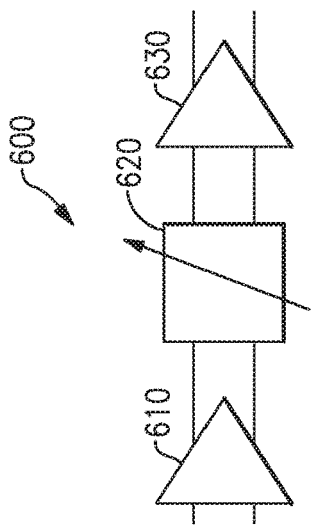
FIG. 6A is a schematic diagram of another example of an amplifier system according to aspects of the present disclosure.

Another approach to an amplifier assembly capable of providing a broad range of selectable gain settings, and accordingly output signal power settings, is illustrated in FIG. 6A. FIG. 6A shows an amplifier system 600 including a first fixed gain amplifier 610, an adjustable attenuator 620 and a second fixed gain amplifier 630. The adjustable attenuator 620 again provides the adjustability to select gain values of the amplifier system 600 overall, similar to the amplifier system 500 discussed above. Again the adjustable attenuator 620 may have a range of selectable attenuation levels that range from 0 dB to 58 dB attenuation, for example. As one example of fixed gain amplifier gain values, the first fixed gain amplifier 610 may have a fixed gain of 15 dB and the second fixed gain amplifier 630 may have a fixed gain of 20 dB, to provide a maximum net gain of +35 dB overall, which occurs when the adjustable attenuator 620 is set to provide substantially 0 dB of attenuation. Accordingly, similar to the amplifier system 500 discussed above, the amplifier system 600 may provide a net gain range of −23 dB to +35 dB overall.

Figure 6D:
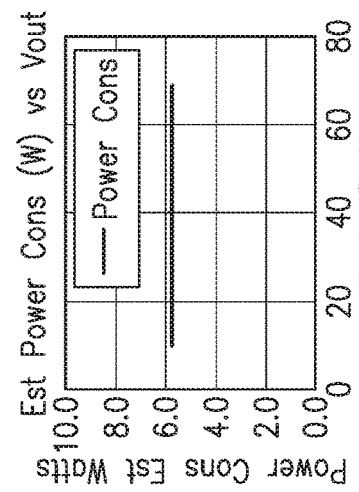
FIGS. 6B-6D are graphs of performance characteristics of the amplifier system shown in FIG. 6A.
Figure 6C:
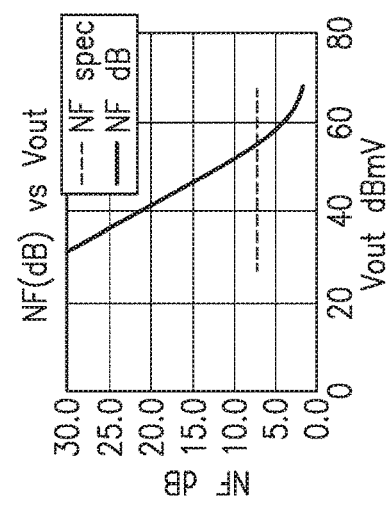
Figure 6B:
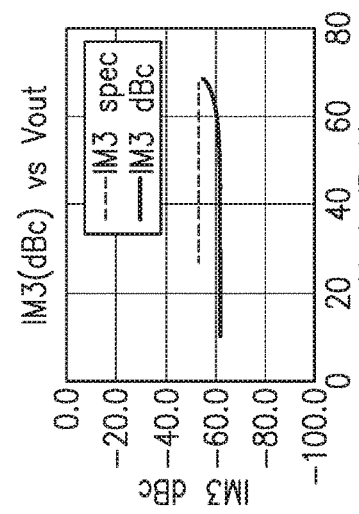

With continued reference to the amplifier system 600 of FIG. 6A, FIGS. 6B-6D illustrate the same performance characteristics of the amplifier system 600 as those displayed in FIGS. 5B-5D for the amplifier system 500. FIGS. 6B and 6C each also includes a dashed line for DOCSIS 3.1 performance requirements. FIG. 6C shows that the amplifier system 600 has worse noise figure characteristics than those of the amplifier system 500 discussed above. Specifically, FIG. 6C shows that at the lower range of output signal levels, the noise figure is significantly higher than for the amplifier system 500, and does not satisfy the DOCSIS 3.1 requirements. Similar to the amplifier system 500 discussed above, the amplifier system 600 relies upon the selectable attenuation levels of an adjustable attenuator 620 to provide the variability of output signal levels. The amplifier system 600, however, has two fixed gain amplifiers, the noise characteristics of which combine poorly at the lower gain settings as each may introduce noise. Additionally, FIG. 6D shows that the amplifier system 600 consumes a substantially constant amount of power across all output signal levels, similar to the amplifier system 500 above, again because reduction in output signal level is achieved by absorbing more power in the adjustable attenuator 620 while the fixed gain amplifiers 610, 630 continue to provide a constant gain and consume significant power. As is the case with the amplifier system 500, selecting low output signal levels for the amplifier system 600 does not reduce power consumption and may cause significant heating as excess power is converted to thermal energy.

A third approach to an amplifier assembly capable of providing a broad range of selectable gain settings, and accordingly output signal power settings, involves providing adjustable gain in an amplifier element in addition to an attenuator element as in the amplifier systems 500, 600 discussed above. When some of the adjustable gain is provided in an amplifier element, an attenuator element may provide less of the adjustable gain. For example, and as shown in FIG. 7A, an amplifier system 700 includes an input stage 710, an adjustable attenuator 720, and an output stage 730. The input stage 710 may include a fixed gain amplifier, which may be a low noise amplifier (LNA). The adjustable attenuator 720 may be similar to those discussed above.

The output stage 730 is an adjustable gain element (e.g., variable gain amplifier circuit) including a variable gain amplifier 740 and a bypass path 750. The bypass path 750 may include a fixed attenuator 760, which may attenuate the signal by a desired amount. While the amount of attenuation may be selected based on a performance requirement of the output stage 730, in one example, the fixed attenuator 760 may include a loss pad which provides 4 dB of attenuation.

In certain examples, components and/or parameters of the output stage 730 may be selected to achieve a desired impedance matching at its input and its output. For instance, the output stage 730 may provide an impedance at its input that matches an output impedance of the adjustable attenuator 720, and the output stage 730 may present an output impedance that matches a cable or balun to be coupled to the output of the output stage 730. In certain examples, the variable gain amplifier 740 may have a 100 Ohm input impedance and a 75 Ohm output impedance, e.g., to match a 100 Ohm output impedance of the adjustable attenuator 720 and a 75 Ohm impedance of a coaxial cable, for instance. Accordingly, when the output stage 730 is in an amplify mode (for example, one of three amplify modes described in further detail below), the variable gain amplifier 740 may provide impedance matching from the adjustable attenuator 720 to an output of the amplifier system 700 overall.

In a bypass mode wherein a signal is routed through the bypass path 750 instead of the variable gain amplifier 740, the fixed attenuator 760 may provide impedance matching from its input to its output, e.g., to provide a 100 Ohm input to match the output of the adjustable attenuator 720 while providing a 75 Ohm output to match a cable or balun connected to the output of the output stage 730. In certain other examples, the bypass path 750 may not include the fixed attenuator 760 and instead may pass the signal directly between the input and output of the output stage 730 during the bypass mode.

The variable gain amplifier 740 and the fixed attenuator 760, each part of the output stage 730, may be alternatively selected to provide an adjustable gain from, for example, −4 dB up to 20 dB, thus providing a 24 dB range of selectable gain settings. With such an output stage 730, the adjustable attenuator 720 may provide a 35 dB range of selectable attenuation to achieve a 59 dB range of overall gain variability from the amplifier system 700. Examples of the output stage 730 are discussed in more detail below.

In at least one embodiment, the input stage 710 provides a fixed 15 dB gain, the adjustable attenuator 720 is a digital switched attenuator (DSA) that provides a range of attenuation from 0 to 34 dB in nominal 1 dB increments, the fixed attenuator 760 is a loss pad that provides 4 dB of attenuation, and the variable gain amplifier 740 provides a selectable gain of 4, 12, or 20 dB by enabling a varying number of amplifier elements as is discussed in more detail below. It is to be appreciated that the amplifier and attenuator components may be designed and constructed to provide any set of amplification gain and/or attenuation values, and embodiments described herein are not limited to specific examples of gain and attenuation values or ranges described. Additionally, embodiments of an amplifier system may include additional bypass circuitry providing different attenuation values or no attenuation, e.g., the bypass path 750 may not have a fixed attenuator 760 and instead may pass a signal substantially without attenuation, or there may be no bypass path 750. Additionally, the variable gain amplifier 740 may provide alternate gain values, including negative gain values, and may provide higher or lower gain values than those explicitly described herein, and may provide more or fewer than three amplify modes as described herein, in any combination to provide variable output signal levels to accommodate varying applications and operational requirements.

Continuing with the particular above-described embodiment, examples of operating states are described that provide for gain settings ranging from a minimum net gain of −23 dB up to a maximum net gain of +35 dB. The minimum net gain of the amplifier system 700 is provided when the adjustable attenuator 720 is set to provide maximum attenuation (34 dB in this example) and the output stage 730 is configured to route a signal through the bypass path 750 that includes the fixed attenuator 760. The resulting net gain of −23 dB is the combination of 15 dB gain of the input stage 710, −34 dB gain of the adjustable attenuator 720, and −4 dB gain of the fixed attenuator 760.

The maximum net gain of the amplifier system 700 is provided when the adjustable attenuator 720 is set to provide 0 dB of attenuation and the output stage 730 is configured to route a signal through the variable gain amplifier 740 set to provide 20 dB of gain. The resulting net gain of +35 dB is the combination of 15 dB gain of the input stage 710 and 20 dB gain of the variable gain amplifier 740. The adjustable attenuator 720 passes a signal without attenuation (0 dB) when the amplifier system 700 is in a maximum gain operating state. For clarity, the gain settings of the input stage 710, the adjustable attenuator 720, and the output stage 730 are shown in Table 1 for the minimum and maximum net gain operating states of this example of the amplifier system 700.

TABLE 1

| Input Stage 710 | Attenuator 720 | Output Stage 730 | Net Gain |
|---|---|---|---|
| +15 dB | −34 dB | −4 dB | −23 dB |
| +15 dB | 0 dB | +20 dB | +35 dB |

Intermediate gain values between the minimum and maximum net gain of the amplifier system 700 overall, e.g., gain values between −23 dB and +35 dB in the example discussed above, may be achieved by varying combinations of gain settings for the adjustable attenuator 720 and the output stage 730, as illustrated in Table 2. Also shown in Table 2 is an output signal level in dBmV for a specific input signal level.

TABLE 2

| Gain Index | Input Stage (dB) | Attenuator (dB) | Output Stage (dB) | Output Stage Mode | Net Gain (dB) | Output Level (dBmV) |
|---|---|---|---|---|---|---|
| 5 | 15 | −34 | −4 | Bypass | −23 | 10 |
| 6 | 15 | −33 | −4 | Bypass | −22 | 11 |
| 7 | 15 | −32 | −4 | Bypass | −21 | 12 |
| 8 | 15 | −31 | −4 | Bypass | −20 | 13 |
| 9 | 15 | −30 | −4 | Bypass | −19 | 14 |
| 10 | 15 | −29 | −4 | Bypass | −18 | 15 |
| 11 | 15 | −28 | −4 | Bypass | −17 | 16 |
| 12 | 15 | −27 | −4 | Bypass | −16 | 17 |
| 13 | 15 | −26 | −4 | Bypass | −15 | 18 |
| 14 | 15 | −25 | −4 | Bypass | −14 | 19 |
| 15 | 15 | −24 | −4 | Bypass | −13 | 20 |
| 16 | 15 | −23 | −4 | Bypass | −12 | 21 |
| 17 | 15 | −22 | −4 | Bypass | −11 | 22 |
| 18 | 15 | −21 | −4 | Bypass | −10 | 23 |
| 19 | 15 | −20 | −4 | Bypass | −9 | 24 |
| 20 | 15 | −19 | −4 | Bypass | −8 | 25 |
| 21 | 15 | −18 | −4 | Bypass | −7 | 26 |
| 22 | 15 | −17 | −4 | Bypass | −6 | 27 |
| 23 | 15 | −16 | −4 | Bypass | −5 | 28 |
| 24 | 15 | −15 | −4 | Bypass | −4 | 29 |
| 25 | 15 | −14 | −4 | Bypass | −3 | 30 |
| 26 | 15 | −13 | −4 | Bypass | −2 | 31 |
| 27 | 15 | −12 | −4 | Bypass | −1 | 32 |
| 28 | 15 | −11 | −4 | Bypass | 0 | 33 |
| 29 | 15 | −10 | −4 | Bypass | 1 | 34 |
| 30 | 15 | −9 | −4 | Bypass | 2 | 35 |
| 31 | 15 | −8 | −4 | Bypass | 3 | 36 |
| 32 | 15 | −7 | −4 | Bypass | 4 | 37 |
| 33 | 15 | −6 | −4 | Bypass | 5 | 38 |
| 34 | 15 | −5 | −4 | Bypass | 6 | 39 |
| 35 | 15 | −4 | −4 | Bypass | 7 | 40 |
| 36 | 15 | −3 | −4 | Bypass | 8 | 41 |
| 37 | 15 | −2 | −4 | Bypass | 9 | 42 |
| 38 | 15 | −1 | −4 | Bypass | 10 | 43 |
| 39 | 15 | 0 | −4 | Bypass | 11 | 44 |
| 40 | 15 | −7 | 4 | Amplify A | 12 | 45 |
| 41 | 15 | −6 | 4 | Amplify A | 13 | 46 |
| 42 | 15 | −5 | 4 | Amplify A | 14 | 47 |
| 43 | 15 | −4 | 4 | Amplify A | 15 | 48 |
| 44 | 15 | −3 | 4 | Amplify A | 16 | 49 |
| 45 | 15 | −2 | 4 | Amplify A | 17 | 50 |
| 46 | 15 | −1 | 4 | Amplify A | 18 | 51 |
| 47 | 15 | 0 | 4 | Amplify A | 19 | 52 |
| 48 | 15 | −7 | 12 | Amplify B | 20 | 53 |
| 49 | 15 | −6 | 12 | Amplify B | 21 | 54 |
| 50 | 15 | −5 | 12 | Amplify B | 22 | 55 |
| 51 | 15 | −4 | 12 | Amplify B | 23 | 56 |
| 52 | 15 | −3 | 12 | Amplify B | 24 | 57 |
| 53 | 15 | −2 | 12 | Amplify B | 25 | 58 |
| 54 | 15 | −1 | 12 | Amplify B | 26 | 59 |
| 55 | 15 | 0 | 12 | Amplify B | 27 | 60 |
| 56 | 15 | −7 | 20 | Amplify C | 28 | 61 |
| 57 | 15 | −6 | 20 | Amplify C | 29 | 62 |
| 58 | 15 | −5 | 20 | Amplify C | 30 | 63 |
| 59 | 15 | −4 | 20 | Amplify C | 31 | 64 |
| 60 | 15 | −3 | 20 | Amplify C | 32 | 65 |
| 61 | 15 | −2 | 20 | Amplify C | 33 | 66 |
| 62 | 15 | −1 | 20 | Amplify C | 34 | 67 |
| 63 | 15 | 0 | 20 | Amplify C | 35 | 68 |

Table 2 documents four modes of operation for the example of an output stage 730. In a first mode, which is a bypass mode in this example, a signal is routed through the bypass path 750 and not routed through the variable gain amplifier 740. In this mode the signal travels through the fixed attenuator 760, resulting in a gain of −4 dB applied by the output stage 730, for example. In addition to the bypass mode, there are three amplify modes wherein the signal is routed through the variable gain amplifier 740 and not routed through the bypass path 750. In each of the amplify modes, the signal is routed through the variable gain amplifier 740 that applies a respective gain to the signal. In one example of the amplifier system 700 discussed above, the first amplify mode of the variable gain amplifier 740 applies a 4 dB gain to the signal, the second amplify mode of the variable gain amplifier 740 applies a 12 dB gain to the signal, and the third amplify mode of the variable gain amplifier 740 applies a 20 dB gain to the signal.

FIG. 7B is a graph of third order intermodulation (IM3) performance for the above example of an amplifier system 700 with respect to output signal levels from 10 dBmV to 68 dBmV. Each of three ripples 770 in the graph occurs at a transition point when the mode of the output stage 730 changes from the bypass mode, to first amplify mode, to second amplify mode, and to third amplify mode, respectively, as the output signal level increases. A dashed line represents a performance limit met by this example of the amplifier system 700, which may, for example, correspond to DOCSIS 3.1 performance requirements. FIG. 7C is a graph of noise figure versus output signal levels. The ripples 780 on this graph similarly occur at the transition points when the output stage 730 changes from bypass, to first, second, and third amplify modes, respectively from left to right on the graph. Again a dashed line represents a performance limit met by this example of the amplifier system 700, which may similarly correspond to DOCSIS 3.1 performance requirements. FIG. 7D is a graph of estimated power consumption versus output signal levels. The steps 790 on this graph represent increasing power requirements, from left to right, of the variable gain amplifier 740 as the output stage 730 mode changes from the bypass mode, to the first, second, and third amplify modes wherein the variable gain amplifier 740 provides 4 dB of gain, 12 dB of gain, and 20 dB of gain, respectively.

As shown in FIG. 7D, the amplifier system 700 has reduced power requirements at lower output signal levels. At least in part, power reductions are achieved for lower desired output signal levels by reducing amplification of the variable gain amplifier 740, which is accomplished by disabling one or more unit cells of semiconductors, transistors, or other amplifier elements when the desired output signal level is relatively low, as discussed in more detail below. In some embodiments, power consumption is further reduced by adjusting an amplifier bias signal, which may be a bias current or a bias voltage, to increase efficiency.

The variable gain amplifier 740 may be coupled to a power supply that may provide source power to the variable gain amplifier 740 in the form of a bias current, which ultimately provides the power of the output signal provided by the variable gain amplifier 740. The bias current provided to the variable gain amplifier 740 may be varied based on the needs of the variable gain amplifier 740 for a particular output level setting of the amplifier system 700. For example, the first, second, and third amplify modes of the variable gain amplifier 740 may not each require the same amount of bias current to provide the first, second, and third amplification gains, for example, 4 dB, 12 dB, and 20 dB. Further efficiency may be achieved, in some embodiments, by adjusting the bias current for a particular amplification gain based upon the particular output level setting. For example, as shown in Table 2, the third amplify mode of the variable gain amplifier 740 is utilized to provide eight distinct output power levels based upon a desired output power level setting. While there are eight such settings, referenced as gain index values 56-63 in Table 2, for example, in which the variable gain amplifier 740 provides a gain of 20 dB, the bias signal provided to the variable gain amplifier 740 may be adjusted for each of the eight settings, to result in more efficient power consumption, based upon a desired output power level setting being achieved by varying the adjustable attenuator 320, which reduces the signal level at the input of the variable gain amplifier 740.

For a selected output signal level, and in at least one embodiment, an amplifier bias signal may be determined that provides enough power to the variable gain amplifier 740 to provide the desired output signal level with sufficient linearity and/or noise characteristics without providing additional power beyond that required. An amplifier bias signal determined necessary for a particular output signal level may be lower than an amplifier bias signal determined necessary for a different output signal level, even for the same gain characteristic of an amplify mode of the variable gain amplifier 740. Each determined value of amplifier bias signal, e.g., for different desired output signal levels, may be recorded in a storage element, such as a lookup table, a register, or similar, and retrieved by a controller, for example, to control the amplifier bias signal provided for each output signal level setting. In the example of the amplifier system 700 discussed above, to provide a range of amplification and output signal levels as illustrated by gain index values 40-63 in Table 2, a transmit signal is routed through the variable gain amplifier 740. When the transmit signal is routed through the variable gain amplifier 740, the variable gain amplifier 740 operates in one of the first, second, or third amplify modes to provide a gain of 4 dB, 12 dB, or 20 dB, respectively.

Table 3 shows, among other things, an example of a set of amplifier bias signal settings for gain index values 40-63 of this example of an amplifier system 700, and illustrates that within a given amplify mode, an amplifier bias signal is increased as the output signal level increases. In this example, the values for the bias signal shown in Table 3 are register values provided to a current digital to analog converter (IDAC) that may provide a reference current from which a bias current is mirrored. Accordingly, the values of the bias signal shown in Table 3 do not represent a current or voltage value, but may be index values for a current or voltage. In some embodiments, the bias signal values may linearly represent a bias current or voltage (e.g., a value of 12 in Table 3 may represent a bias signal that is 20% higher than a value of 10 in Table 3). In other embodiments, bias signal values may be any value, not necessarily linearly representative of a bias current or voltage.

TABLE 3

| Gain Index | Amp 740 Bias Signal | Amp 740 Mode | Amp 740 Gain (dB) | Net Gain (dB) | Output Level (dBmV) |
|---|---|---|---|---|---|
| 40 | 15 | Amplify A | 4 | 12 | 45 |
| 41 | 15 | Amplify A | 4 | 13 | 46 |
| 42 | 15 | Amplify A | 4 | 14 | 47 |
| 43 | 16 | Amplify A | 4 | 15 | 48 |
| 44 | 17 | Amplify A | 4 | 16 | 49 |
| 45 | 18 | Amplify A | 4 | 17 | 50 |
| 46 | 19 | Amplify A | 4 | 18 | 51 |
| 47 | 20 | Amplify A | 4 | 19 | 52 |
| 48 | 10 | Amplify B | 12 | 20 | 53 |
| 49 | 10 | Amplify B | 12 | 21 | 54 |
| 50 | 10 | Amplify B | 12 | 22 | 55 |
| 51 | 11 | Amplify B | 12 | 23 | 56 |
| 52 | 12 | Amplify B | 12 | 24 | 57 |
| 53 | 14 | Amplify B | 12 | 25 | 58 |
| 54 | 17 | Amplify B | 12 | 26 | 59 |
| 55 | 19 | Amplify B | 12 | 27 | 60 |
| 56 | 11 | Amplify C | 20 | 28 | 61 |
| 57 | 11 | Amplify C | 20 | 29 | 62 |
| 58 | 12 | Amplify C | 20 | 30 | 63 |
| 59 | 13 | Amplify C | 20 | 31 | 64 |
| 60 | 14 | Amplify C | 20 | 32 | 65 |

TABLE 3-continued

| Gain Index | Amp 740 Bias Signal | Amp 740 Mode | Amp 740 Gain (dB) | Net Gain (dB) | Output Level (dBmV) |
|---|---|---|---|---|---|
| 61 | 15 | Amplify C | 20 | 33 | 66 |
| 62 | 17 | Amplify C | 20 | 34 | 67 |
| 63 | 19 | Amplify C | 20 | 35 | 68 |

Figure 7E:
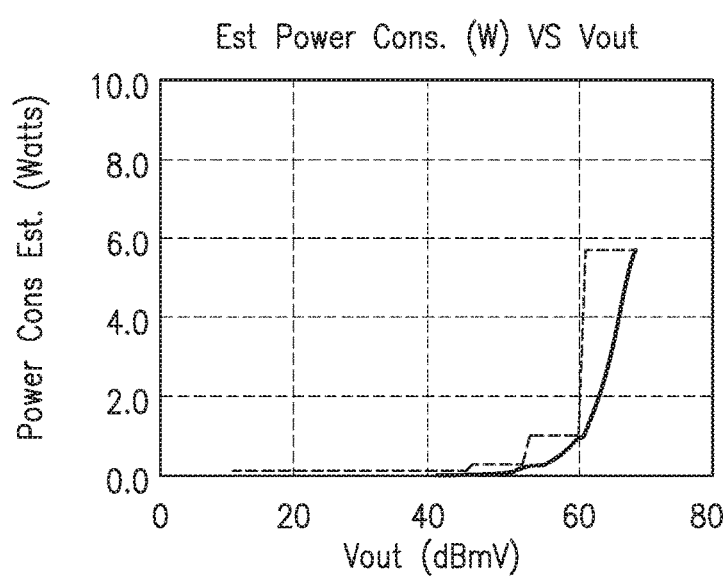

FIG. 7E is a graph of power consumption similar to FIG. 7D except that FIG. 7E incorporates adjusted bias current for each net gain, e.g., for differing output signal level settings. The dashed line plotted in FIG. 7E is a reproduction of the power consumption shown in FIG. 7D, for reference, and the solid curve plotted in FIG. 7E is the adjusted power consumption when an adjusted bias current is incorporated as discussed above. It is to be appreciated that while the example of the amplifier system 700 discussed above includes three amplify modes, each of which is used to provide a set of eight overall gain values, and accordingly a set of eight output signal levels, this is merely an example of one set of such values. Other embodiments of an amplifier system in accord with aspects and embodiments described herein may include more or fewer amplify modes with more or fewer gain settings, and various gain values and output signal levels may be provided by one or more amplify or bypass modes.

In certain examples, the variable gain amplifier 740 may be configured to maintain, or controlled to maintain, a substantially constant input-referred linearity across various combinations of the range of gain values and attenuation levels of the associated amplifier system. As discussed herein, input-referred linearity may refer to various types of measurements of linearity of the variable gain amplifier 740, as referenced at an input of the variable gain amplifier 740. For instance, in one example the variable gain amplifier 740 may be a high-linearity complementary metal-oxide-semiconductor (CMOS) power amplifier which maintains a substantially constant (e.g., ±1 or ±3 dB) input-referred third order intercept point (IIP3) for each of a plurality of amplify modes and substantially across the full spectrum of the DOCSIS 3.1 specification (i.e., from 5-204 MHz). In various implementations, the particular tolerance range of variations in the IIP3 may depend on the particular performance requirements of the variable gain amplifier 740 and associated amplifier system. For instance, in some examples a slight variability in IIP3 may be tolerated to improve the power efficiency of the variable gain amplifier 740.

Figure 8:
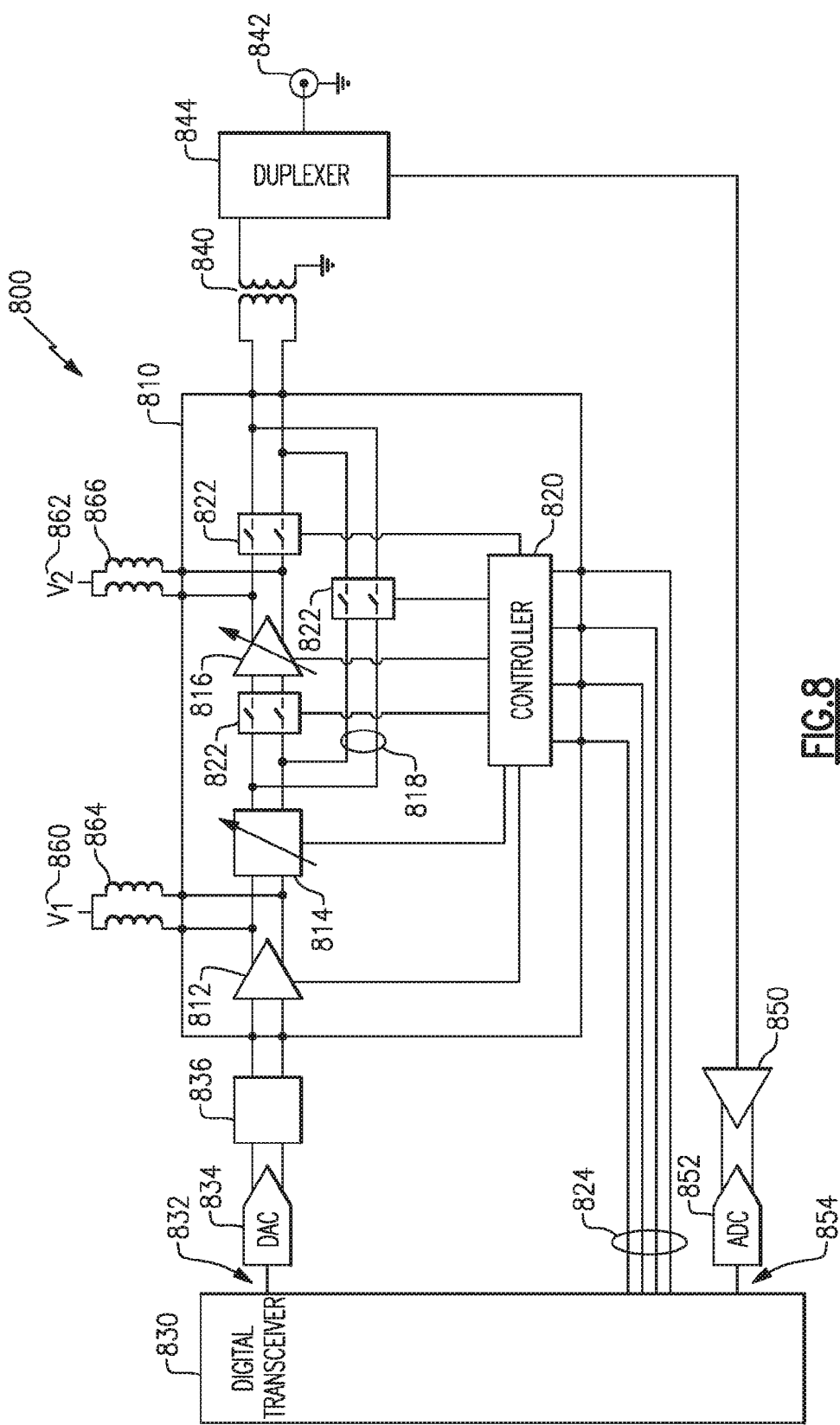
FIG. 8 is a schematic diagram of an example of a cable modem according to aspects of the present disclosure.

FIG. 8 is a schematic diagram of a cable modem 800 incorporating an amplifier system 810 in accord with aspects and embodiments disclosed herein. The amplifier system 810 includes a fixed gain amplifier 812, an adjustable attenuator 814, a variable gain amplifier 816, and a bypass path 818, in a manner similar to the amplifier system 700 previously described with respect to FIG. 7A. The fixed gain amplifier 812, adjustable attenuator 814, variable gain amplifier 816, and bypass path 818 may each be differential elements having two differential inputs and two differential outputs, or may be single-sided elements having a single input and a single output relative to a reference potential, e.g., ground. The amplifier system 810 also includes a controller 820 that controls settings of the fixed gain amplifier 812, the adjustable attenuator 814, and the variable gain amplifier 816, as discussed further below, as well as controlling various switches 822 that may route a signal through various elements, and for example, may route a signal through the variable gain amplifier 816 or alternatively through the bypass path 818. The controller 820 may receive instructions via a control interface 824 from, e.g., a digital transceiver 830. The digital transceiver 830 receives and generates digital data signals to communicate user data from a local network to the CMTS.

When transmitting, the digital transceiver 830 provides a digital transmit signal 832 to a digital to analog converter (DAC) 834. The DAC 834 converts the digital transmit signal 832 into analog signals, which may be further processed by one or more other components 836, e.g., filtered, up-converted, and the like, before being provided to the input of the amplifier system 810 at the fixed gain amplifier 812. The amplifier system 810 applies a variable gain to the transmit signal to increase or decrease the signal level in accord with configuration instructions provided to the controller 820 by, e.g., the digital transceiver 830. The desired gain typically may be selected by the digital transceiver 830 in response to commands from the CMTS to increase or decrease the transmit signal level.

A balun 840 may be used to couple the transmit signal (provided by the amplifier system 810 at the desired signal level) to a coaxial cable connector 842. The balun 840 converts the signal from a differential and balanced form to an unbalanced form, and may also match the signal to the impedance of a cable expected to be connected to the connector 842, e.g., 75 Ohms in typical coaxial cable distribution systems. Additionally, the transmit signal may pass through a duplexer 844. The duplexer 844 separates transmit signals from receive signals by, for example, separating signals by frequency range, for example with a combination of a high pass filter and a low pass filter. The duplexer 844 may provide received signals to a low noise amplifier 850 that amplifies the received signals prior to a conversion into digital form by an analog to digital converter (ADC) 852 that provides a digital receive signal 854 to the digital transceiver 830. Also illustrated in FIG. 8 are power connections 860, 862 that may independently provide power to the fixed gain amplifier 812 and the variable gain amplifier 816 via inductors 864, 866. For example, in at least one embodiment, the fixed gain amplifier 812 may be supplied from a 3.3V supply and the variable gain amplifier 816 may be supplied from a 10V supply. As described further below, a bias current or voltage supplied to either of the fixed gain amplifier 812 or the variable gain amplifier 816 may be varied to improve the efficiency of the stage or amplifier.

It is to be appreciated that while the amplifier system 810 illustrated in FIG. 8 is shown having differential components (e.g., amplifiers, attenuators, inputs, outputs, etc.) and is shown coupled to a balun, alternate embodiments may be single-sided or may process unbalanced signals, and may not require a balun at the output to couple to a transmission medium, or may require a balun in an alternate embodiment to couple an unbalanced output signal to a balanced transmission medium. Additionally, in certain embodiments, an amplifier system may be coupled to power without inductors, such as inductors 864, 866, or may be coupled to a power source through alternate or additional components. Additionally, any components necessary for coupling to a power source may be provided as part of the amplifier system, e.g., internal to the amplifier system rather than external to the amplifier system as shown in FIG. 8

As discussed above, it is to be appreciated that not all elements of a cable modem are shown in FIG. 8, additional components and circuitry may be included that are not shown, such as up-converters and down-converters, for example.

An amplifier system in accord with aspects and embodiments described herein may be implemented in a number of physical technologies and topologies. An amplifier system may include an input stage amplifier, an adjustable attenuator, a variable gain amplifier, and a bypass signal path, or any combination or subset of these, implemented in various arrangements and manufactured from various techniques. Any of these components may be implemented in a substrate or in a die and may be designed for and manufactured from various semiconductor materials, such as Silicon (Si), Germanium (Ge), Gallium Arsenide (GaAs), for example, using various design technologies, such as complementary metal-oxide semiconductor (CMOS), Silicon on insulator (SOI), double-diffused metal-oxide semiconductor (DMOS), laterally diffused metal-oxide semiconductor (LDMOS), bipolar CMOS/DMOS (BCD), pseudomorphic high-electron-mobility transistor (pHEMT), enhancement/depletion mode (E/D-mode) pHEMT, or various combinations of these or other materials and technologies.

In at least one embodiment, an amplifier system may include a fixed gain amplifier implemented on a GaAs ED-pHEMT die, a digital switched attenuator (DSA) implemented on an SOI die, a variable gain amplifier implemented on a BCD-LDMOS die, and a controller implemented on a bulk CMOS die. Each of the dies may be mounted upon or coupled to a substrate with interconnections to each other within the substrate, or by other conducting materials, to convey signals between the various inputs, outputs, and controlled elements of each die, and the set of dies on the substrate may be packaged into a multi-chip module (MCM) with a physical format suitable for incorporation into a device, such as a cable modem, by, for example, mounting and/or soldering to a circuit board.

Figure 9:
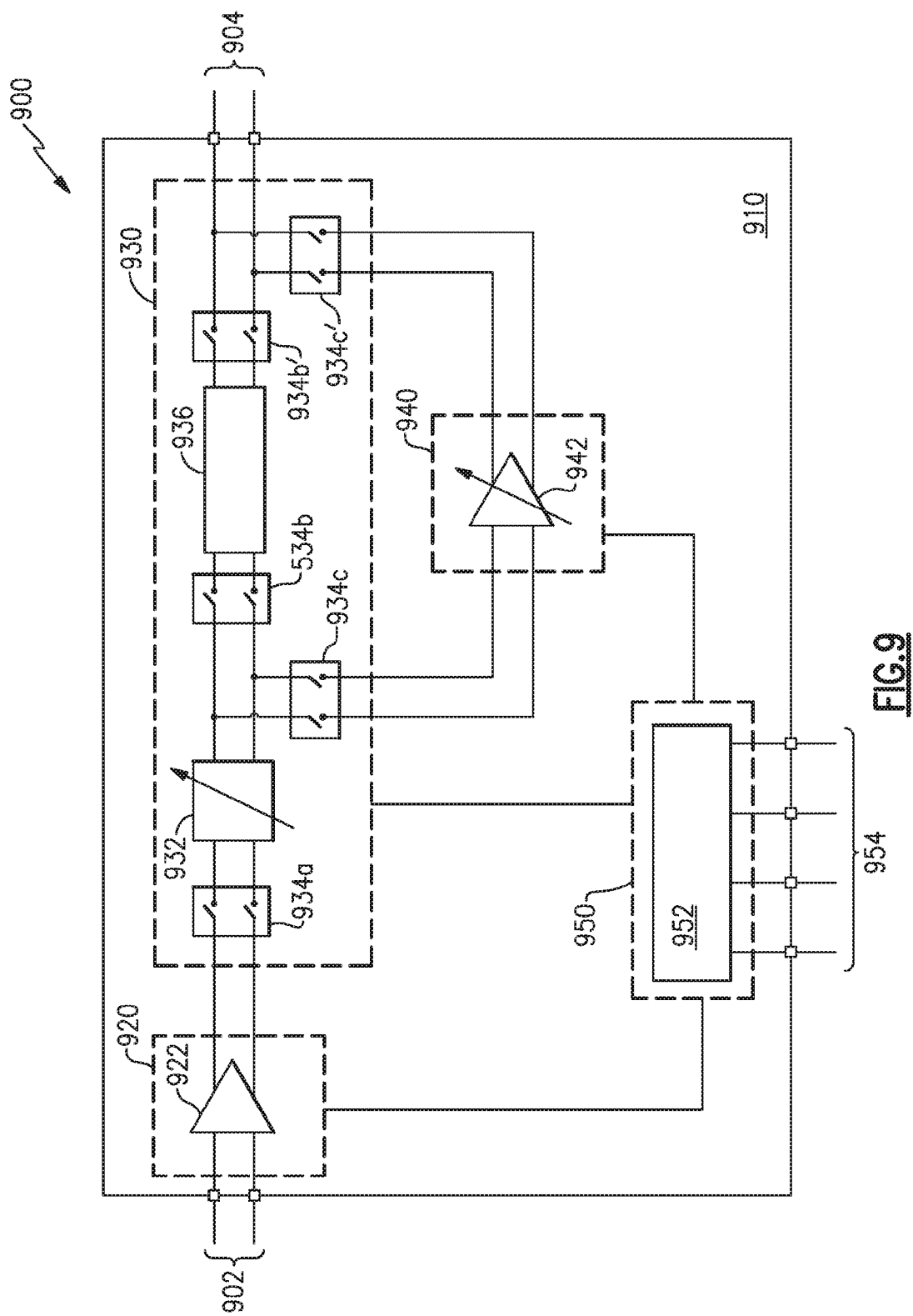
FIG. 9 is a schematic diagram of another example of an amplifier system according to aspects of the present disclosure.

FIG. 9 shows an example of an amplifier system 900, similar in manner to the amplifier system 810 described above with respect to FIG. 8, implemented as a multi-chip module. The amplifier system 900 has an input 902 for receiving balanced differential transmit signals and an output 904 for providing balanced differential transmit signals of differing signal levels. The amplifier system 900 includes multiple chip dies, as described individually in more detail below, provided on a substrate 910. A first die 920 is coupled to the input 902 and includes a fixed gain amplifier 922. A second die 930 is coupled to the output of the fixed gain amplifier 922 and includes a switch 934a that selectively couples the output of the fixed gain amplifier 922 to an adjustable digital switched attenuator 932, and switches 934b, 934c that selectively route the transmit signal from the output of the digital switched attenuator 932 to either of a fixed attenuator 936, e.g., a loss pad, in a bypass mode, or to a third die 940 that includes a variable gain amplifier 942, in an amplify mode. The switches 934 may be multiple switches as shown or may be fewer switches implemented with, e.g., single-pole double-throw switches that alternately make a connection to one or another signal path. In some embodiments, some of the switches 934 may be configured to enable a signal path upon receiving a particular control signal and others of the switches 934 may be configured to disable a signal path upon receiving a similar control signal. In some embodiments, inverters may be provided such that a single control signal may cause some of the switches 934 to enable a signal path and cause others of the switches 934 to disable a signal path. The switches 934 may be implemented as transistors or any suitable technology.

The amplifier system 900 also includes a fourth die 950 that includes a controller 952 that provides control signals to components included on one or more of the first, second, and third dies. For example, the controller 952 may communicate with or control the attenuation settings of the digital switched attenuator 932, control amplify modes and gain values of the variable gain amplifier 942, control bias levels (e.g., current or voltage) provided to the fixed gain amplifier 922 and/or to the variable gain amplifier 942, and control the switches 934 to place the output stage in bypass mode or amplify mode and to establish the overall net gain of the amplifier system 900. The controller 952 may control the various components based upon instructions it receives via a control interface 954.

Although not shown in FIG. 9, in certain embodiments the amplifier system 900, and corresponding multi-chip module, may further include a receive path amplifier, such as the low noise amplifier 850 illustrated in FIG. 8, for example.

Figure 10:
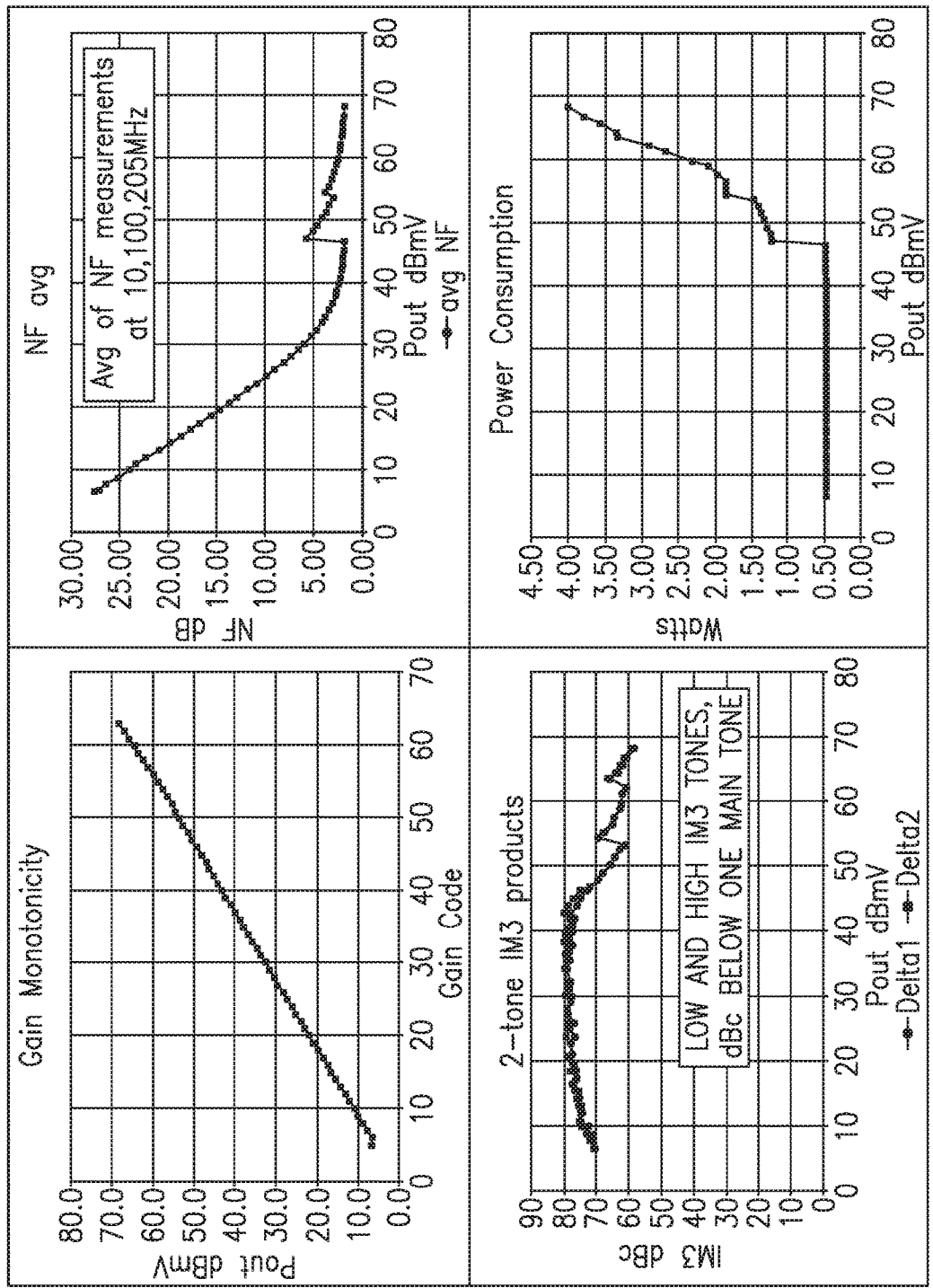
FIG. 10 are graphs of performance characteristics of an embodiment of the amplifier system shown in FIG. 9.

FIG. 10 is a set of graphs illustrating performance characteristics for an amplifier system, such as the amplifier systems 700, 810, 900 described above, having a fixed gain amplifier as an input stage, an adjustable attenuator, and a variable gain amplifier with a bypass path as an output stage, with specifications as described by Table 4. The amplifier system associated with the results shown in FIG. 10 includes bias control, as discussed above, wherein a bias current (or voltage) provided to the variable gain amplifier (a component of the output stage) depends upon the selected output power level setting, to increase power efficiency, the effect of which can be seen in the power consumption graph for output signal levels above 45 dBmV. In some embodiments, a bias level (e.g., current or voltage) provided to the fixed gain amplifier may be controlled in a similar and/or variable manner.

TABLE 4

| | |
|---|---|
| Frequency Range | 5 MHz to 204 MHz |
| Input Stage | Fixed Gain Amplifier, (e.g., Low Noise Amplifier) |
| | Gain: 15 dB (fixed) |
| | Noise FIG.: 1 dB |
| | Input IP3: 15 dBm |
| | Output IP3: 30 dBm |
| Adjustable Attenuator | Selectable 0-34 dB attenuation in 1 dB steps |
| Output Stage | Variable Gain Amplifier |
| | Gain: 4, 12, 20 dB (selectable) |
| | Noise FIG.: 10, 9, 8 dBm |
| | Input IP3: 30 dBm (all gain settings) |
| | Output IP3: 34, 42, 50 dBm |
| | Bypass Path |
| | 4 dB Loss Pad |

During the low gain mode of operation the variable gain amplifier 942 may provide a total of 4 dB of gain, during the medium gain mode the variable gain amplifier 942 may provide a total of 12 dB of gain, and during the high gain mode the variable gain amplifier 942 may provide a total of 20 dB of gain. Table 5 illustrates one example of the gain (in dB), noise figure (in dB), input-referred third order intercept point (IIP3) (in dB), output-referred third order intercept point (OIP3) (in dB), and estimated Power Consumption (in watts) of an amplifier system (e.g., the amplifier system 900 of FIG. 9) including the variable gain amplifier 942, during the low gain, medium gain, high gain, and bypass modes of operation.

TABLE 5

| | Gain (dB) | NF (dB) | IIP3 (dBm) | OIP3 (dBm) | Power Consumption (W) |
|---|---|---|---|---|---|
| High Gain Mode | 20 | 8 | 30 | 50 | 5.6 |
| Medium Gain Mode | 12 | 9 | 30 | 42 | 0.89 |
| Low Gain Mode | 4 | 10 | 30 | 34 | 0.14 |
| Bypass Mode | −4 | 4 | inf | inf | 0 |

In at least one embodiment, an amplifier system may be provided as a packaged multi-chip module, with packaging such as an overmold that substantially encapsulates the substrate and the various dies and components thereon, and including connectivity to the exterior of the packaging to provide signal and control interconnections. An amplifier system in accord with aspects and embodiments described herein may be provided on a single chip or die and may be packaged into a chip-scale package. Any of an amplifier system, multi-chip module, or chip-scale package as described herein may be used as an upstream amplifier for, e.g., a DOCSIS cable modem, or as a selectable-gain signal amplifier for any suitable application, such as a radio frequency amplifier or part of a front-end module. Component characteristics may be altered to provide an amplifier system in accord with aspects and embodiments described herein to provide amplification across a number of frequency ranges, gain values, output levels, linearity, noise characteristics, and other performance criterion to be suitable for various applications and changing operational parameters.

Referring again to FIG. 9, in at least one embodiment, the first die 920 is implemented with GaAs ED-pHEMT technology, the second die 930 is implemented with SOI technology, the third die 940 is implemented with BCD-LDMOS technology, and the fourth die 950 is implemented with CMOS technology. In at least one embodiment, an amplifier system such as the amplifier system 900 of FIG. 9 may include a receive amplifier, such as the low noise amplifier 850 illustrated in FIG. 8.

Referring to FIGS. 8 and 9, each illustrates a controller 820, 952, respectively, to provide control signals to various components of the associated amplifier systems as described herein. For example, a controller may provide control signals to control attenuation settings, gain settings, signal routing switches, power supply (e.g., bias) settings, and other components to establish operational characteristics of an amplifier system. A controller, such as the controllers 820, 952, may establish operational characteristics of the amplifier system in response to commands from another device or component, such as the digital transceiver 854 of FIG. 8. Accordingly, such a controller may have a control interface, such as control interfaces 824, 954. Additionally, a controller may control the timing of changes applied to various components to prevent or reduce conflicts, electrical shorts, spurious emissions, signal transients, disallowed or undesirable states, or changes in input or output impedances, and the like. Examples of a control interface 824, 954 include, but are not limited to, a serial peripheral interface (SPI) or serial data interface (SDI), general purpose input/output (GPIO), mobile industry processor interface (MIPI), or the like. Additionally, the controller may control the various components of the amplifier system via direct or indirect control lines or via similar communication interfaces to those described above coupled to other controllers associated with the component being controlled. For example, an adjustable digital switched attenuator may have its own controller in communication with the amplifier system controller and/or a variable gain amplifier may have its own controller in communication with the amplifier system controller.

Figure 11:
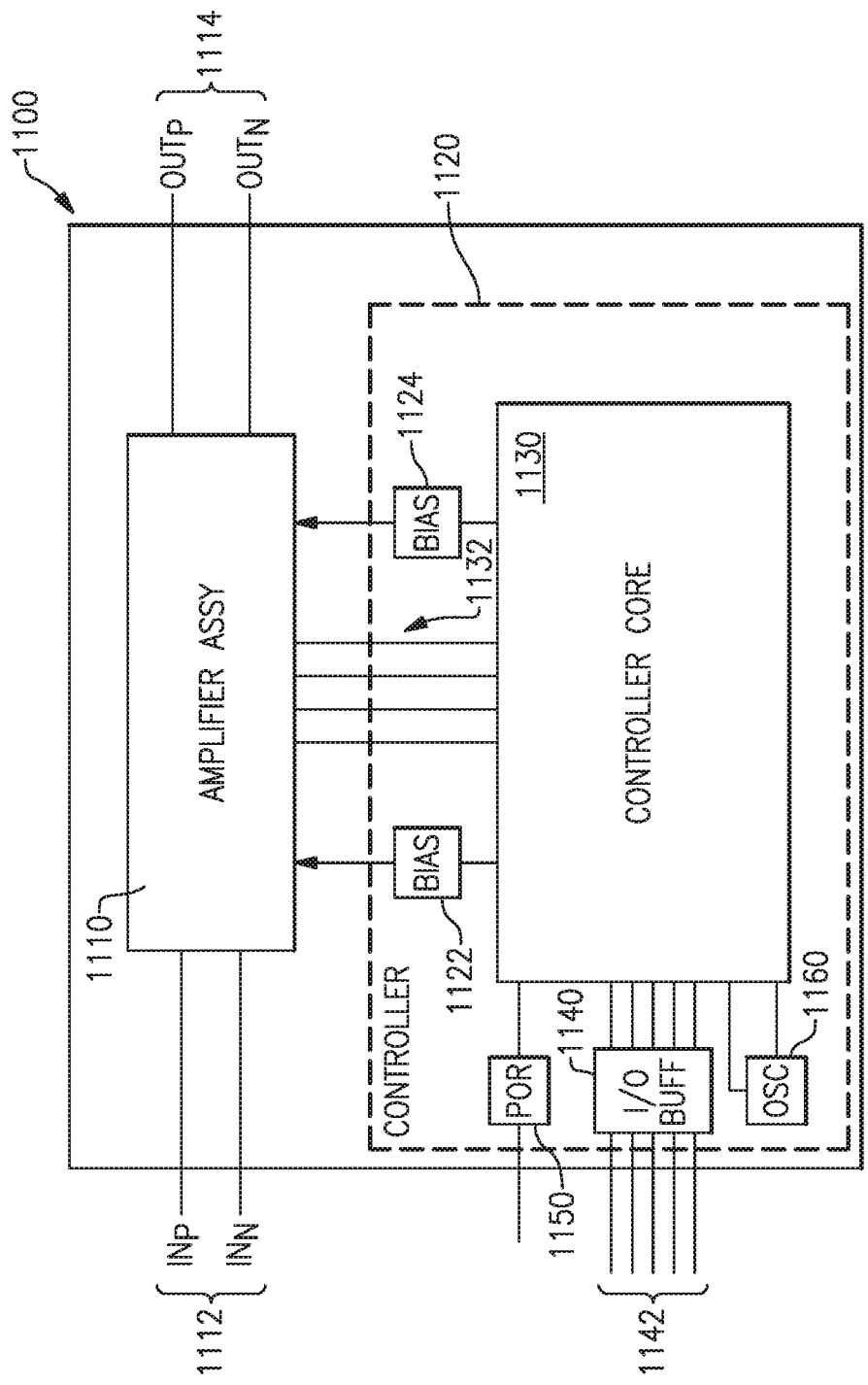
FIG. 11 is a schematic diagram of another example of an amplifier system according to aspects of the present disclosure.

Thus, referring to FIG. 11, there is illustrated one example of a system 1100 incorporating an amplifier assembly 1110, which may include the amplifier systems 810 or 900, for example, and a controller 1120. The amplifier assembly 1110 receives an input 1112 and provides an amplified output 1114. As shown in FIG. 11, the input 1112 may be a differential input, and the output 1114 may be a differential output.

The controller 1120 may include first and second bias circuits 1122 and 1124 for biasing components of the amplifier assembly 1110, as discussed above. The controller 1120 includes a controller core 1130 that provides control for the biasing circuits 1122 and 1124, and which may provide additional control signals to the amplifier assembly 1110 via control line(s) 1132. As discussed above, the controller core 1130 may provide control signals to control attenuation settings, gain settings, signal routing switches, power supply settings, and other components to establish operational characteristics of the amplifier assembly 1110, for example. The controller core 1130 may receive instructions or commands from one or more external components, as discussed above, and may provide feedback or other information to one or more external components over signal line(s) 1142, which are optionally routed through an input/output buffer 1140.

In certain examples, the controller 1120 includes a power-on-reset circuit 1150 that establishes a startup configuration. For example, when power is applied, the power-on-reset circuit 1150 may clear or reset registers or other memory, set registers to appropriate initial values, establish baseline parameters via the control lines 1132, reset the input/output buffer 1140, and establish initial communication or parameters for the signal line(s) 1142.

The controller 1120 may further include an oscillator 1160 in communication with the controller core 1130. The oscillator 1160 may provide a reference signal to allow the controller 1120 to control the timing of changes applied to various components. The controller 1120 may control the timing of changes to various components to prevent or reduce spurious emissions, signal transients, disallowed or undesirable states, changes in input or output impedances, and the like. In certain embodiments, the oscillator 1160 may be temperature compensated, and in some embodiments may be a differential resistive-capacitive relaxation oscillator.

Having described above several aspects of at least one example, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A broadband amplifier assembly having a signal input and a signal output, comprising:
   a fixed gain amplifier having an input and an output, the input coupled to the signal input;
   an adjustable attenuator having an input and an output, the input of the adjustable attenuator being coupled to the output of the fixed gain amplifier;

a variable gain amplifier having an input coupled to the output of the adjustable attenuator and an output coupled to the signal output, the variable gain amplifier having a substantially constant input-referred linearity across a range of gain levels; and a controller coupled to the fixed gain amplifier, the adjustable attenuator, and the variable gain amplifier and configured to control an amount of attenuation provided by the adjustable attenuator and an amount of gain provided by the variable gain amplifier to maintain a substantially constant input-referred linearity across a range of output power levels provided by a combination of the fixed gain amplifier, the adjustable attenuator, and the variable gain amplifier.

2. The amplifier assembly of claim 1 further comprising a bypass path switchably coupled in parallel to the variable gain amplifier and one or more switches configured to switchably route a signal through one of the variable gain amplifier and the bypass path.

3. The amplifier assembly of claim 2 wherein the bypass path includes a bypass attenuator.

4. The amplifier assembly of claim 3 wherein the bypass attenuator is a fixed attenuator.

5. The amplifier assembly of claim 3 wherein the bypass attenuator has an input impedance substantially matched to an output impedance of the adjustable attenuator and an output impedance substantially matched to an impedance of the signal output.

6. The amplifier assembly of claim 5 wherein the input impedance has a value different from a value of the output impedance.

7. A broadband amplifier assembly having a signal input and a signal output, comprising:
a fixed gain amplifier having an input and an output, the input coupled to the signal input;
an adjustable attenuator having an input and an output, the input of the adjustable attenuator being coupled to the output of the fixed gain amplifier;
a variable gain amplifier having an input coupled to the output of the adjustable attenuator and an output coupled to the signal output, the variable gain amplifier having a substantially constant input-referred linearity across a range of gain levels; and
a controller configured to maintain the substantially constant input referred linearity of the variable gain amplifier across a range of output power levels by controlling an amount of attenuation provided by the adjustable attenuator, an amount of gain provided by the variable gain amplifier, and a bias signal provided to the variable gain amplifier.

8. The amplifier assembly of claim 7 wherein the controller is configured to adjust the bias signal based upon at least one of a desired signal level at the signal output, a signal level at the input of the variable gain amplifier, and an attenuation level of the adjustable attenuator.

9. The amplifier assembly of claim 7 wherein the controller is configured to adjust the bias signal based upon at least one of a linearity criterion and an efficiency criterion.

10. The amplifier assembly of claim 7 wherein the controller is configured to adjust the bias signal based upon a lookup table.

11. A broadband amplifier assembly having a signal input and a signal output, comprising:
a fixed gain amplifier having an input and an output, the input coupled to the signal input;
an adjustable attenuator having an input and an output and having a range of attenuation levels, the input of the adjustable attenuator coupled to the output of the fixed gain amplifier;
a variable gain amplifier having an input coupled to the output of the adjustable attenuator and an output coupled to the signal output, the variable gain amplifier having a range of gain levels; and
a controller coupled to the fixed gain amplifier, the adjustable attenuator, and the variable gain amplifier and configured to control an amount of attenuation provided by the adjustable attenuator and an amount of gain provided by the variable gain amplifier to maintain a noise factor at the signal output across combinations of the range of gain levels and the range of attenuation levels provided by a combination of the fixed gain amplifier, the adjustable attenuator, and the variable gain amplifier.

12. The amplifier assembly of claim 11 further comprising a bypass path switchably coupled in parallel to the variable gain amplifier and one or more switches configured to switchably route a signal through one of the variable gain amplifier and the bypass path.

13. The amplifier assembly of claim 12 wherein the bypass path includes a bypass attenuator.

14. The amplifier assembly of claim 13 wherein the bypass attenuator is a fixed attenuator.

15. The amplifier assembly of claim 13 wherein the bypass attenuator has an input impedance substantially matched to an output impedance of the adjustable attenuator and an output impedance substantially matched to an impedance of the signal output.

16. The amplifier assembly of claim 15 wherein the input impedance has a value different from a value of the output impedance.

17. The amplifier assembly of claim 11 wherein the controller is further configured to maintain the noise factor in part by controlling a bias signal provided to the variable gain amplifier.

18. The amplifier assembly of claim 17 wherein the controller is configured to adjust the bias signal based upon at least one of a desired signal level at the signal output, a signal level at the input of the variable gain amplifier, and an attenuation level of the adjustable attenuator.

19. The amplifier assembly of claim 17 wherein the controller is configured to adjust the bias signal based upon at least one of a linearity criteria and an efficiency criteria.

20. The amplifier assembly of claim 17 wherein the controller is configured to adjust the bias signal based upon a lookup table.

21. A broadband amplifier assembly having a signal input and a signal output, comprising:
a fixed gain amplifier having an input and an output, the input coupled to the signal input;
an adjustable attenuator having an input and an output and having a range of attenuation levels, the input of the adjustable attenuator coupled to the output of the fixed gain amplifier;
a variable gain amplifier having an input coupled to the output of the adjustable attenuator and an output coupled to the signal output, the variable gain amplifier having a range of gain levels; and
a controller configured to control an amount of attenuation provided by the adjustable attenuator, to control a gain provided by the variable gain amplifier, and to control a bias signal provided to the variable gain amplifier across the range of gain levels.

22. The amplifier assembly of claim 21 wherein the controller is further configured to control the bias signal based upon at least one of a linearity criterion and an efficiency criterion.

23. The amplifier assembly of claim 21 wherein the controller includes a bias control coupled to the variable gain amplifier to provide the bias signal to the variable gain amplifier, the bias signal being one of a bias current and a bias voltage.

24. The amplifier assembly of claim 21 further comprising a bypass path switchably coupled in parallel to the variable gain amplifier and one or more switches configured to switchably route a signal through one of the variable gain amplifier and the bypass path.

25. The amplifier assembly of claim 24 wherein the bypass path includes a bypass attenuator.

26. The amplifier assembly of claim 25 wherein the bypass attenuator has an input impedance substantially matched to an output impedance of the adjustable attenuator and an output impedance substantially matched to an impedance of the signal output.

27. The amplifier assembly of claim 21 wherein the controller is further configured to maintain a substantially constant input-referred linearity of the variable gain amplifier across a range of output power levels, at least in part by controlling the bias signal provided to the variable gain amplifier.

28. The amplifier assembly of claim 27 wherein the controller is configured to adjust the bias signal based upon at least one of a desired signal level at the signal output, a signal level at the input of the variable gain amplifier, and an attenuation level of the adjustable attenuator.

29. The amplifier assembly of claim 21 wherein the controller is configured to adjust the bias signal based upon a lookup table.

30. A multi-chip module having a signal input and a signal output, comprising:
a first die constructed from a GaAs ED-pHEMT technology and including components that form a fixed gain amplifier having an input and an output, the input of the fixed gain amplifier being coupled to the signal input;
a second die constructed from a SOI technology and including components that form an adjustable attenuator having an input and an output, the input of the adjustable attenuator being coupled to the output of the fixed gain amplifier; and
a third die constructed from a BCD-LDMOS technology and including components that form a variable gain amplifier having an input and an output, the input of the variable gain amplifier being switchably coupled to the output of the adjustable attenuator, and the output of the variable gain amplifier being switchably coupled to the signal output.

31. The multi-chip module of claim 30 further comprising a fourth die constructed from a bulk CMOS technology and including components that form a controller having a plurality of control outputs, the plurality of control outputs including a first control output coupled to the fixed gain amplifier, a second control output coupled to the adjustable attenuator, and a third control output coupled to the variable gain amplifier.

32. The multi-chip module of claim 30 wherein the second die further includes components that form a signal switch, the signal switch being configured to provide the switchable coupling between the output of the adjustable attenuator and the input of the variable gain amplifier.

33. The multi-chip module of claim 30 wherein the second die further includes components that form a fixed attenuator, an input of the fixed attenuator being switchably coupled to the output of the adjustable attenuator and an output of the fixed attenuator being switchably coupled to the signal output.

34. The multi-chip module of claim 33 wherein a characteristic impedance of the output of the fixed attenuator is different from a characteristic impedance of the input of the fixed attenuator.

35. The multi-chip module of claim 30 further comprising a receive signal input and a receive signal output, and an additional die including components that form a receive amplifier having an input coupled to the receive signal input and having an output coupled to the receive signal output.

* * * * *